(12) United States Patent
Huang

(10) Patent No.: US 6,933,541 B1
(45) Date of Patent: Aug. 23, 2005

(54) EMITTER TURN-OFF THYRISTORS (ETO)

(75) Inventor: Alex Q. Huang, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 0 days.

(21) Appl. No.: 09/486,779

(22) PCT Filed: Sep. 30, 1998

(86) PCT No.: PCT/US98/20594

§ 371 (c)(1),
(2), (4) Date: Mar. 2, 2000

(87) PCT Pub. No.: WO99/17374

PCT Pub. Date: Apr. 8, 1999

Related U.S. Application Data

(60) Provisional application No. 60/060,557, filed on Sep. 30, 1997.

(51) Int. Cl.[7] .................. H01L 29/74; H01L 31/111
(52) U.S. Cl. ................ 257/177; 257/133; 257/138; 257/147; 257/150; 257/180; 257/181
(58) Field of Search .................. 257/119, 177, 133, 257/135, 138, 139, 140, 146, 147, 163, 150, 257/180, 181

(56) References Cited

U.S. PATENT DOCUMENTS 4,768,075 A * 8/1988 Broich et al. ............... 257/181
5,856,683 A * 1/1999 Schlangenotto ............ 257/140

* cited by examiner

Primary Examiner—Steven Loke
(74) Attorney, Agent, or Firm—Whitham, Curtis & Christofferson, P.C.

(57) ABSTRACT

A family of emitter controlled thyristors employ plurality of control schemes for turning the thyristor an and off. In a first embodiment of the present invention a family of thyristors are disclosed all of which comprise a pair of MOS transistors, the first of which is connected in series with the thyristor and a second which provides a negative feedback to the thyristor gate. A negative voltage applied to the gate of the first MOS transistor causes the thyristor to turn on to conduct high currents. A zero to positive voltage applied to the first MOS gate causes the thyristor to turn off. The negative feedback insures that the thyristor only operates at its breakover boundaries of the latching condition with the NPN transistor portion of the thyristor operating in the active region. Under this condition, the anode voltage $V_A$ continues to increase without significant anode current increase. Emitter turn-off (ETO) thyristor fabrication packages are also disclosed having packaged semiconductor devices controlling the thyristor.

17 Claims, 24 Drawing Sheets

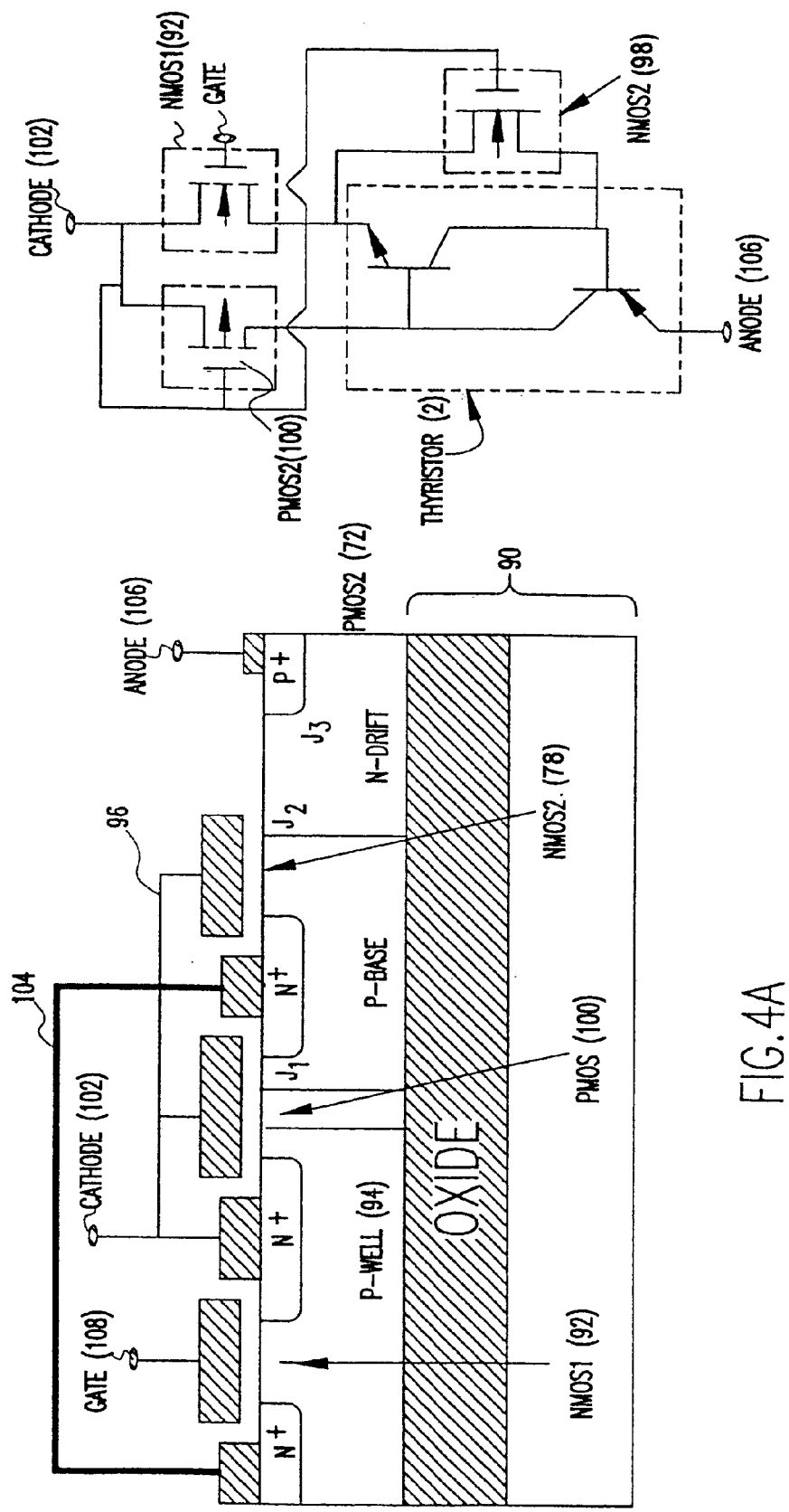

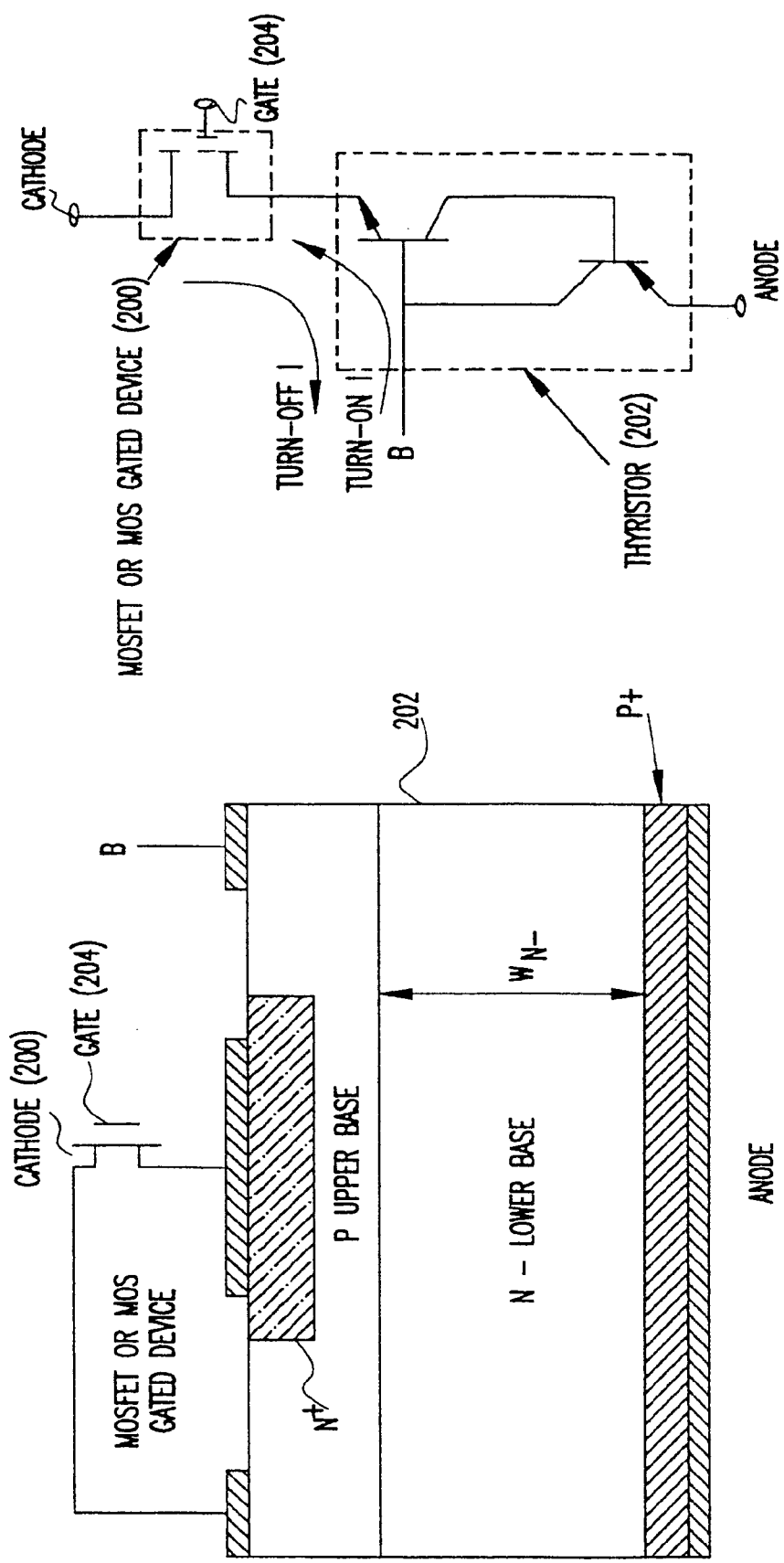

EMITTER TURN-OFF THYRISTORS (ETO)

This application is the national phase of PCT International Application No. PCT/US98/20594 filed on Sep. 30, 1998 under 35 U.S.C. § 371. This application also claims priority of provisional Application No. 60/060,557 filed in United States on Sep. 30, 1997.

BACKGROUND OF THE INVENTION

1. Field of the Invention

The present invention generally relates to a novel family of thyristors and, more particularly, to a family of low cost metal oxide semiconductor (MOS) emitter turn-off thyristors.

2. Description of the Prior Art

Thyristors, sometimes referred to as silicon controlled rectifiers, are four layer pnpn devices comprising an anode, a cathode, and a gate terminal. Thyristors are designed to carry very high currents with very little voltage drop. For example, at currents of up to 500 A, the voltage drop across the anode and cathode terminals typically does not exceed 2 V. This makes thyristors ideal for power electronics switching applications such as converting one power form to another, such as, for example dc-ac or dc-dc.

Standard thyristors are turned on by applying a short current pulse across the cathode and gate terminals. Once the device is turned on, high currents may flow between the anode and cathode. Unfortunately, the gate can only be used to turn the device on, it cannot be used to turn the device off. Turn-off is accomplished by applying a reverse voltage across the anode and the cathode. Several variations of the standard thyristor have been developed to facilitate the turn-off operation such as, for example, gate turn-off thyristors (GTO) and metal-oxide semiconductor (MOS)-controlled thyristors (MCTs).

Gate turn-off thyristors (GTO) have been developed which can turn the device off by applying a reverse gate pulse to bypass carriers directly to the gate circuit. However, GTO's are known to have a poor turn off current gain. For example, a GTO having a 2000 A peak current may require up to 500 A of reverse gate current.

The MOS-controlled thyristor (MCT) has been around for about a decade and is basically a thyristor including two built in MOS transistors, one to turn the thyristor on, and one to turn it off. The gates of the two MOS transistors are tied together. A relatively low negative voltage pulse (i.e., −7 V) to the gates turn the thyristor on, and a positive pulse (i.e., 14 V) to the gates turn the thyristor off. Hence, the MCT has the advantage of being able to be driven directly by logic gates. However, MCTs are typically expensive to fabricate and very difficult to scale to high voltage (e.g., >2 KV) and high current (e.g., >100 A).

SUMMARY OF THE INVENTION

It is therefore an object of the present invention to provide an improved family of emitter turn-off (ETO) thyristors which are suitable for operation in high frequency and which are inexpensive to fabricate.

It is yet another object of the present invention to provide an improved family of emitter turn-off thyristor (ETO) to replace the GTO, and an improved family of emitter-controlled thyristor (ECT) to replace MCT. ETO and ECT are based on the same operation principle of emitter control, but ETO is a hybrid device hence is inexpensive in fabrication, while the ECT is a monolithic device that requires standard power device fabrication process.

Disclosed herein is a family of emitter controlled thyristors (ECT) and emitter turn-off thyristors ETO employing a plurality of control schemes for turning the thyristor on and off. In a first embodiment of the present invention a family of thyristors are disclosed all of which comprise a pair of MOS transistors, the first of which is connected in series with the thyristor (hence after called emitter switch, or $Q_E$ or Q1) and a second which provides a connection from the thyristor gate to the cathode or ground (hence after called gate switch or $Q_G$ or Q2). A third optional MOSFET (hence after called $Q_{ON}$ or Q3) is used to provide the turn-on mechanism for the thyristor. Depending on whether a n-channel or p-channel device is used for $Q_E$. A negative voltage applied to the gate of the first MOS causes the thyristor to turn on to conduct high currents. A zero to positive voltage applied to the first MOS gate causes the thyristor to turn off. A negative feedback mechanism also exist between the $Q_E$ and $Q_G$ at high currents that causes the ECT to operate at its breakover boundaries of the latching condition with the NPN transistor portion of the thyristor operating in the active region. Under this condition, the anode voltage $V_A$ continues to increase without significant anode current increase. ETO devices disclosed here also use at least two switches $Q_G$ and $Q_E$ to control the current. They also have the negative feedback mechanism that causes the current to saturate at high currents. In particular, ETO fabrication packages are also disclosed having packaged semiconductor devices controlling the thyristor.

BRIEF DESCRIPTION OF THE DRAWINGS

The foregoing and other objects, aspects and advantages will be better understood from the following detailed description of a preferred embodiment of the invention with reference to the drawings, in which:

FIGS. 1C and 1D are a cross sectional view and an equivalent circuit diagram, respectively, of an emitter controlled thyristor similar to that of FIGS. 1A–B having an additional NMOS transistor connected across the thyristor for device turn-on;

FIGS. 4A and 4B are a cross-sectional view of a lateral NMOS emitter controlled thyristor (LNECT) controlled thyristor and its circuit equivalent, respectively;

FIGS. 9A and 9B are a cross-sectional view of an emitter turn off thyristor (ETO) and its circuit equivalent, respectively, according to a second embodiment of the present invention;

DETAILED DESCRIPTION OF A PREFERRED EMBODIMENT OF THE INVENTION

Figure 1B:
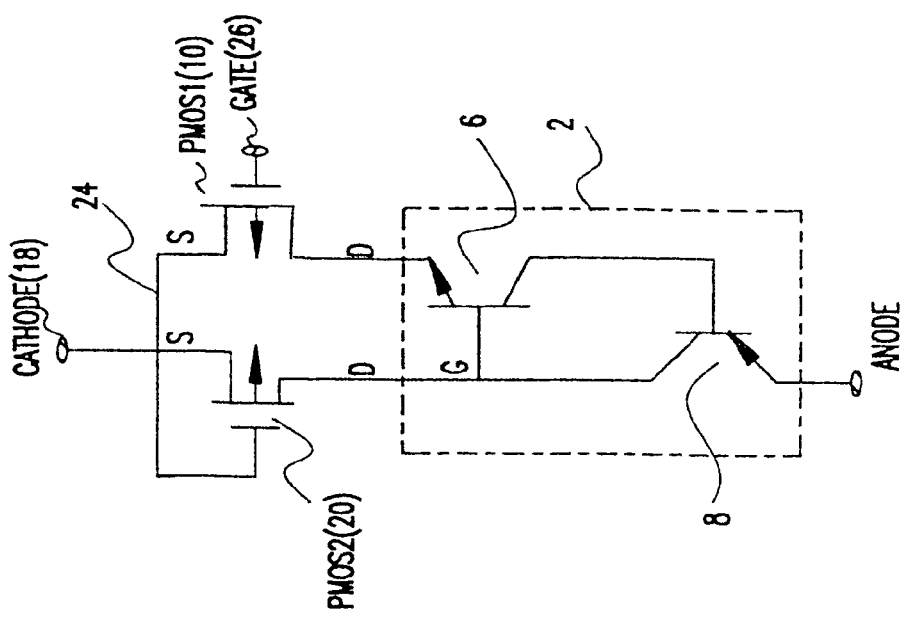
FIGS. 1A and 1B are a cross sectional view and an equivalent circuit diagram, respectively, of an emitter controlled thyristor according to a first embodiment of the invention.
Figure 1A:
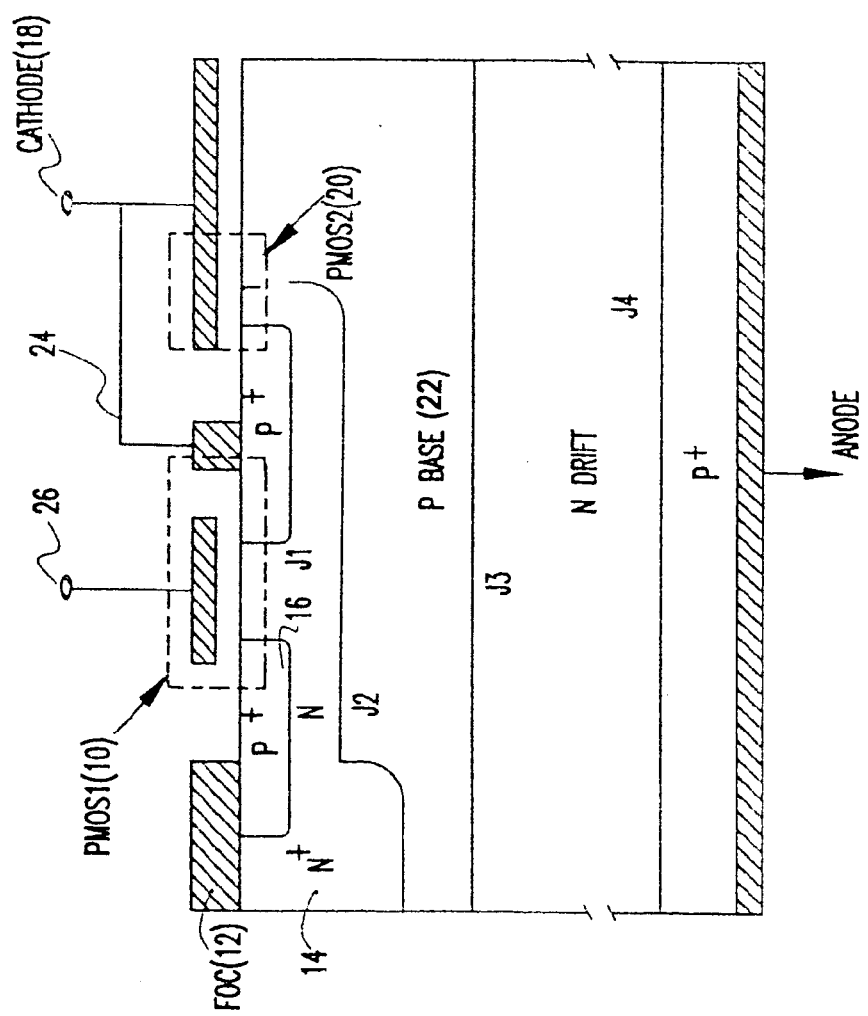

Referring now to the drawings, and more particularly to FIGS. 1A and 1B, there is shown a cross-sectional view of the emitter controlled thyristor (ECT) and its equivalent circuit, respectively. The ECT has a four-layer PNPN thyristor structure 2, in series with a P channel MOSFET (PMOS1) 10 integrated on the top N layer. In FIG. 1B the PNPN thyristor is shown as a PNP bipolar transistor 6 and NPN bipolar transistor 8. A Floating Ohmic Contact (FOC) 12 shorting the N emitter 14 and the P+ region 16 which acts as the source of the PMOS1 10. The FOC 12 provides the bridge for transferring emitter electron currents of the upper NPN transistor into hole currents, which then flow through the PMOS1 10 channel and into the cathode contact 18. A second PMOSFET (PMOS2) 20 is formed at the other side of the cathode contact with the upper P base 22 acting as the source. The PMOS2 does not have a separate control gate, instead, its gate 24 is tied to the cathode contact 18.

During the forward current conduction, a large negative gate voltage is applied to the main gate 26, the ECT current flows vertically along the PNPN thyristor structure, and then laterally flows through the series PMOS1 and into the cathode 18. The ECT's forward voltage drop is therefore that of a thyristor plus that of the PMOS1 10.

With the increase of the current, the voltage of the FOC 12, $V_{FOC}$, will increase due to the channel resistance of the PMOS1 10. When $V_{FOC} > -V_{T2}$, where $V_{T2} < 0$ is the threshold voltage of the PMOS2 20, the PMOS2 20 turns "on", and hole currents will be diverted from the upper base through the PMOS2 20 into the cathode 18. The turn-on of the PMOS2 20 will reduce the upper NPN transistor's 6 current gain. If the reduction of the upper NPN transistor 6 current gain, $\Delta\alpha_{npn}$, cannot be compensated by an increase of the lower PNP transistor 8 current gain, $\Delta\alpha_{npn}$, so that $$\alpha_{npn0} + \alpha_{pnp0} - \Delta\alpha_{pnp} \leq 1 \tag{1}$$

then the ECT will come out of latching state. If this happens, the current flowing through the PMOS1 10 will tend to decrease, and so will the $V_{FOC}$. A reduced $V_{FOC}$ means a reduction of the diverted current through the PMOS2 20 and the decrease of the $\Delta\alpha_{npn}$; hence, the ECT enters latching again. Such negative feedback mechanism, therefore, leads to the fact that the main thyristor 2 can only operate at the breakover boundaries of the latching condition with the NPN transistor 6 operating in the active region. Under this condition, the anode voltage $V_A$ continues to increase without significant anode current increase, and the increased anode voltage is supported by the main junction J3. The lower PNP transistor 8 (also operating in the active region) supplies base current for the upper NPN transistor 6, and the saturation current is the holding current of the thyristor with both PMOS1 10 and PMOS2 20 conducting. This phenomena is called high voltage current saturation or forward bias safe operation area (FBSOA). At very high voltages, the increase of $\alpha_{pnp}$ will compensate $\alpha_{npn}$, and the ECT will tend to latch again until equation (1) is violated. The violation point can be considered to correspond to the ECT's FBSOA boundary point.

The ECT can be turned-off by increasing the gate electrode voltage to zero or positive value in PMOS1 10, which interrupts the main current flow path. All currents are then forced to divert to the cathode by the PMOS2 20. Both emitter switch (PMOS1) and emitter short (PMOS2) are used in the turn-off of the ETC., and unlike in the EST, no parasitic thyristor limits the reverse bias safe operation area (RBSOA) of the ECT.

Figure 1D:
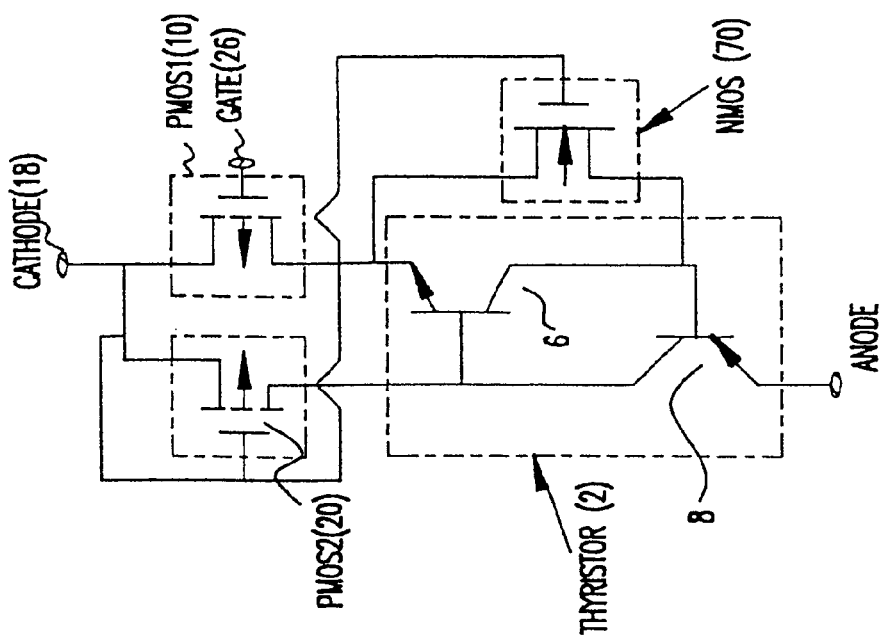
Figure 1C:
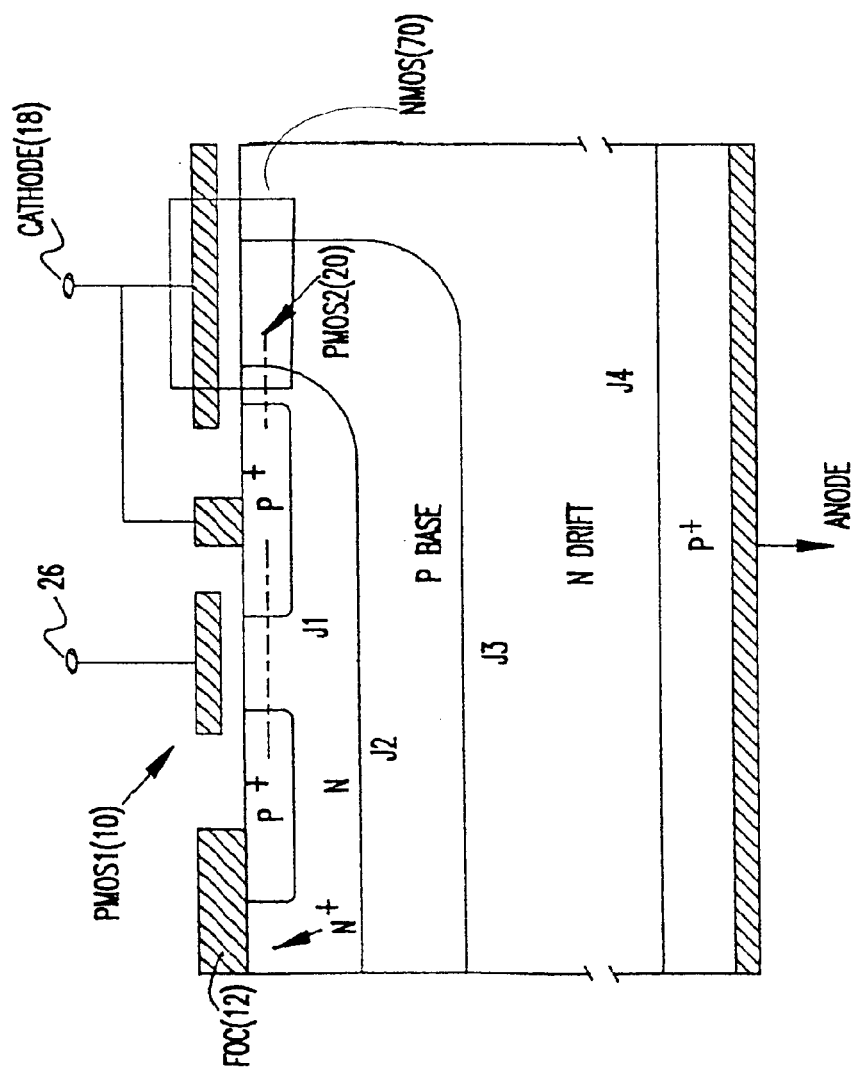

FIGS. 1C and 1D show an ECT and its schematic equivalent having MOS turn-on, and an emitter switch for MOS turn-off. As shown in FIG. 1D, the thyristor of FIG. 1C–D is similar to that shown in FIGS. 1A–B with the addition of an NMOS transistor 70. The additional NMOS 70 is designed to be a depletion MOSFET. The gate of it is also tied to ground. The leakage current of this MOSFET will turn-on the ECT when a negative gate voltage is applied to the main control gate, 26.

Figure 2B:
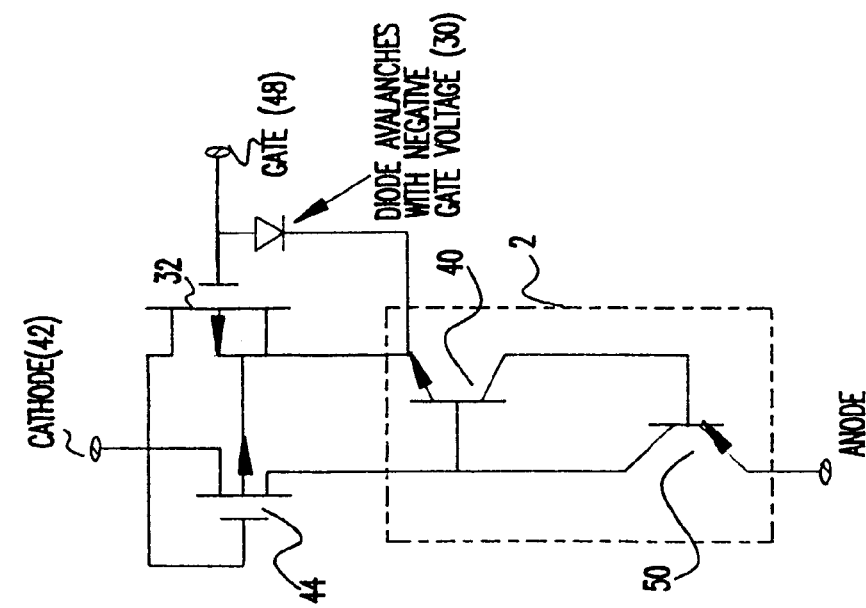
FIGS. 2A and 2B are a cross-sectional view of the ECT with a turn-on cell (ECT-OC) and its circuit equivalent, respectively.
Figure 2A:
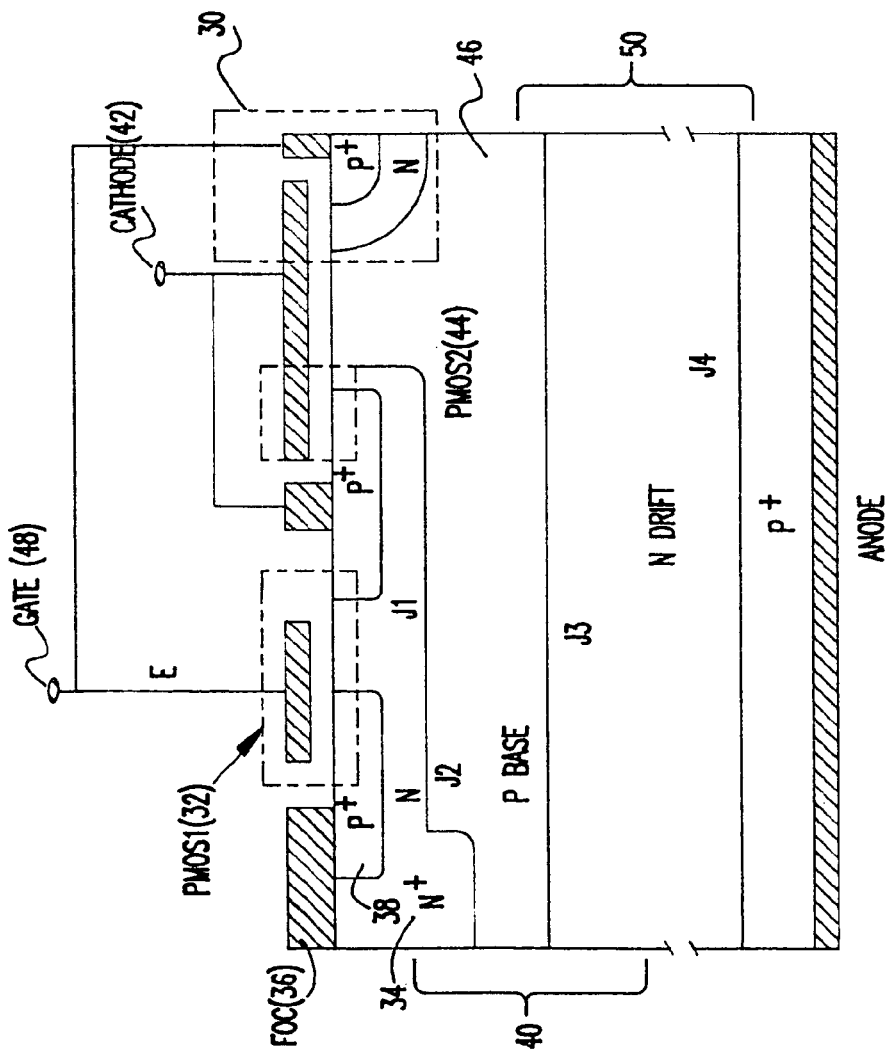

Referring now to FIG. 2A there is shown a cross-sectional view of the ECT with a novel turn-on cell (ECT-OC) 30 and FIG. 2B shows its circuit equivalent. The circuit is similar to the one shown in FIG. 1 with the addition of an avalanche diode 30 connected between the gate 48 of the first PMOS and the thyristor. The ECT-OC has a 4-layer PNPN thyristor structure 2 in series with a P channel MOSFET (PMOS1) 32 integrated on the top N layer 34. A Floating Ohmic Contact (FOC) 36 shorting a P+ region 38 and the N emitter acts as the source of the PMOS1 32. The FOC 36 provides the bridge for transferring emitter electron currents of the upper NPN transistor 40 into hole currents, which then flow through the PMOS1 32 channel and into the cathode contact 42. A second PMOSFET (PMOS2) 44 is formed at the other side of the cathode contact 42 with the upper P base 46 acting as the source. The PMOS2 44 does not have a separate control gate, instead, its gate is tied to the cathode contact 42. A P+-N diode 46 forms the turn-on cell located in the top N region, and its P+ anode is tied to the gate electrode of the ECT-OC.

When a positive bias is applied to the anode and a negative gate voltage is applied to the gate electrode 48, the avalanche breakdown will be appeared at the P+-N junction of the turn-on cell 30. Electrons created by the avalanche breakdown will injected into the thyristor and trigger the thyristor into the latching state. The ECT-OC current flows vertically along the P+-N-P-N thyristor structure, and then laterally flows through the series PMOS1 32 and into the cathode 42. The ECT-OC's forward voltage drop is therefore that of a thyristor plus that of the PMOS1 32. With the increase of the current, the voltage of the FOC 36, $V_{FOC}$, will increase due to the channel resistance of the PMOS1 32. When $V_{FOC} > -V_{T2}$, where $V_{T2} < 0$ is the threshold voltage of the PMOS2 44, the PMOS2 44 turns 'on', and hole currents will be diverted from the upper base through the PMOS2 44 into the cathode 42. The turn-on of the PMOS2 44 will reduce the upper NPN transistor's current gain. If the reduction of the upper NPN transistor 40 current gain, $\Delta\alpha_{npn}$, cannot be compensated by an increase of the lower PNP 50 transistor current gain, $\Delta\alpha_{pnp}$, so that $$\alpha_{npn0} + \alpha_{pnp0} - \Delta\alpha_{npn} + \Delta\alpha_{pnp} \leq 1 \quad (2)$$

then the ECT-OC will come out of latching state. If this happens, the current flowing through the PMOS1 32 will tend to decrease, and so will the $V_{FOC}$. A reduced $V_{FOC}$ means a reduction of the diverted current through the PMOS2 44 and the decrease of the $\Delta\alpha_{npn}$, hence the ECT-OC enters latching again. Such negative feedback mechanism, therefore, leads to the fact that the main thyristor can only operate at the breakover boundaries of the latching condition with the NPN transistor 40 operating in the active region. Under this condition, the anode voltage $V_A$ continues to increase without significant anode current increase, and the increased anode voltage is supported by the main junction J3. The lower PNP transistor 50 (also operating in the active region) supplies base current for the upper NPN transistor 40, and the saturation current is the holding current of the thyristor with both PMOS1 32 and PMOS2 44 conducting. At very high voltages, the increase of $\Delta\alpha_{pnp}$ will compensate $\Delta\alpha_{npn}$ and the ECT-OC will tend to latch again until equation (2) is violated. The violation point can be considered to correspond to the ECT-OC's FBSOA boundary point.

The ECT-OC can be turned-off by increasing the gate electrode 48 voltage to zero or positive value in the PMOS1 32, which interrupts the main current flow path. All currents are then forced to divert to the cathode by the PMOS2 44. Both emitter switch (PMOS1) 32 and emitter short (PMOS2) 44 are used in the turn-off of the ECT, and unlike in the EST, no parasitic thyristor limits the RBSOA of the ECT-OC.

Figures 3A, 3B:
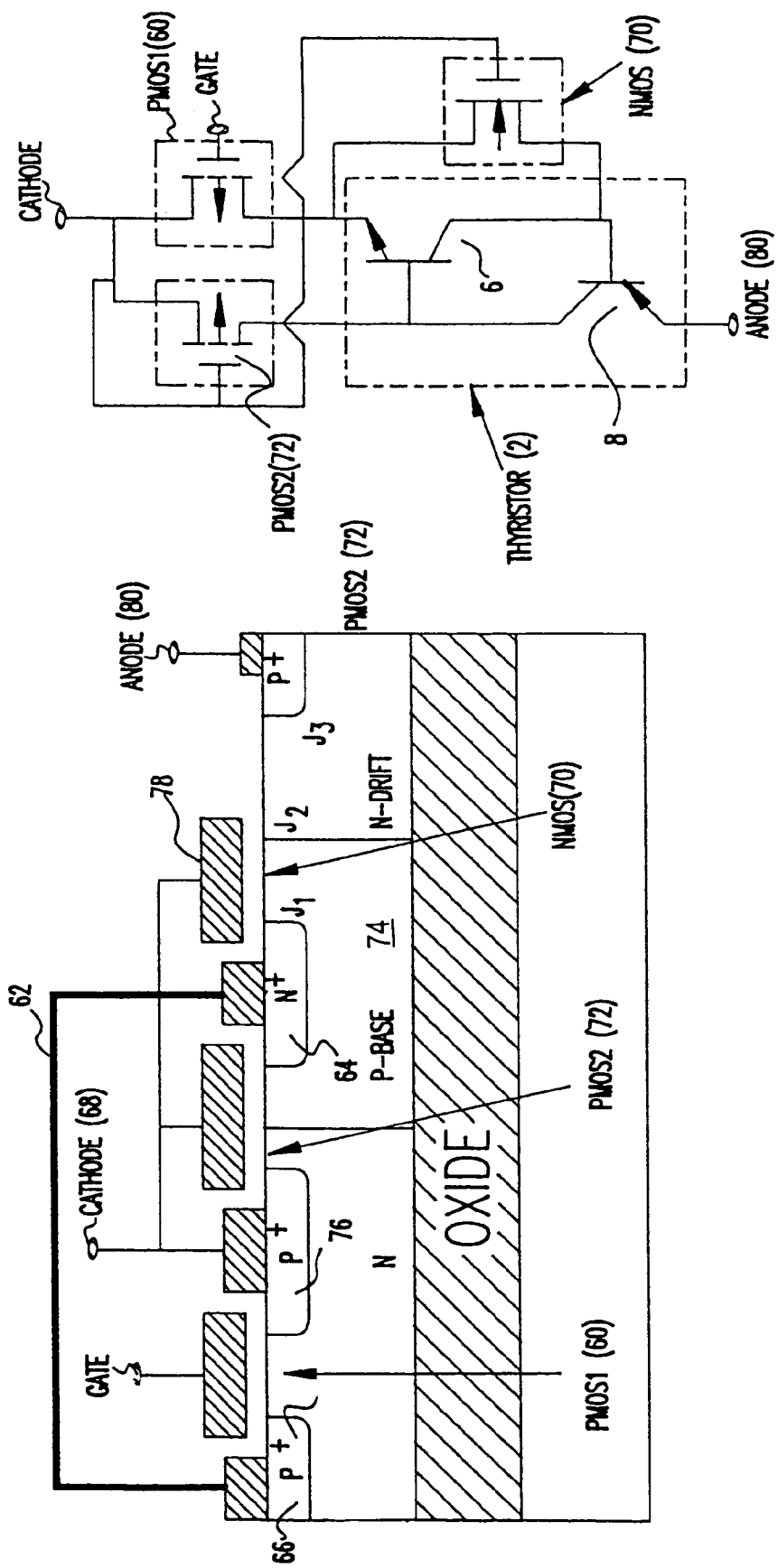
FIGS. 3A and 3B are a cross-sectional view of a lateral emitter controlled thyristor (LECT), respectively.

FIGS. 3A–B show lateral emitter controlled thyristor (LECT) cross-section and its equivalent circuit diagram, respectively on a silicon oxide SiO substrate. The LECT has a lateral 4-layer P+-N-P-N+ thyristor structure 2 in series with a P channel MOSFET (PMOS1) 60 integrated on the surface of the N layer through a Floating Ohmic Contact (FOC) metal strap 62. The FOC 62 connects the upper N+ emitter 64 of the PNPN thyristor and the P+ source region 66 of the PMOS1 60. The FOC 62 provides the bridge for transferring emitter electron currents of the NPN transistor into hole currents, which then flow through the PMOS1 60 channel and into the cathode contact 68. An N-channel depletion mode MOSFET (NMOS) 70 is also integrated at the surface of the LECT which acts as the turn-On MOSFET. A second PMOSFET (PMCS2) 72 is formed between the P base 74 and the P+ drain 76 of the PMOS1 60 with the P base 74 acting as its source. The NMOS 70 and the PMOS2 72 share the same gate 78, and the gate is directly tied to the cathode contact 68, hence, the LECT is a three-terminal device.

When a positive bias is applied to the anode 80 and a negative gate voltage is applied to the gate electrode 78, the depletion mode NMOS 70 will inject electrons into the n-drift region of the thyristor and trigger the thyristor into the latching state. The latching current flows into the N+ emitter 64 of the thyristor and then flows into the cathode 68 through the FOC metal strap 62 and the series PMOS1 60. The LECT's forward voltage drop is therefore that of a thyristor plus that of the PMOS1 60. With the increase of the current, the voltage at the FOC metal strap 62, $V_m$, will increase, the PMOS2 72 will be turned 'on' and hole currents will be diverted from the p base through the PMOS2 72 into the cathode 68. Consequently, the turn-on of the PMOS2 72 will reduce the NPN transistor's current gain. If the reduction of the NPN transistor current gain, $\Delta\alpha_{npn}$ cannot be compensated by an increase of the PNP transistor current gain, $\Delta\alpha_{pnp}$ so that $$\alpha_{npn0} + \alpha_{pnp0} - \Delta\alpha_{npn} + \Delta\alpha_{pnp} \leq 1 \quad (3)$$

then the LECT will come out of latching state. If this happens, the current flowing through the PMOS2 72 will tend to decrease, and so will the $V_m$. A reduced $V_m$ means a reduction of the diverted current through the PMOS2 72 and the decrease of the $\Delta\alpha_{npn}$ hence the LECT enters latching again. Such negative feedback mechanism, therefore, leads to the fact that the main thyristor can only operate at the breakover boundaries of the latching condition with the NPN transistor operating in the active region. Under this condition, the anode voltage $V_A$ continues to increase without significant anode current increase, and the increased anode voltage is supported by the main junction J2. and the LECT has a high voltage current saturation capability.

The LECT can be turned-off by increasing the gate electrode 78 voltage to zero or positive to turned 'off' the PMOS1 60, which interrupts the main current flow path, and all currents are then forced to divert to the cathode 68 by the PMOS2 72. Moreover, both emitter switch and emitter short are used in the turn-off of the LECT, no parasitic thyristor limits the Reverse Bias SCA (RBSCA) of the LECT.

Referring now to FIGS. 4A–B, there is shown a cross-sectional view of another lateral emitter controlled thyristor (LNECT) on the silicon oxide (SiO) substrate 90 and its equivalent circuit, respectively. The LNECT has a lateral 4-layer P+-N-P-N+ thyristor 2 structure in series with a N channel MOSFET (NMOS1) integrated on the surface of the P well through a Floating Ohmic Contact (FOC) metal strap. The FOC connects the upper N+ emitter of the PNPN thyristor and the N+ drain region of the NMOS1. An N-channel depletion mode MOSFET (NMOS2) is also integrated at the surface of the LNECT which acts as the turn-on MOSFET. A P-channel MOSFET (PMOS) is formed between the P base and the P well with the P base acting as its source. The cathode shorts the N+ source of the NMOS1

92 and the P well 94. The gate electrode 96 of the NMOS2 98 and the PMOS is directly tied to the cathode contact 102; hence, the LNECT is a three-terminal device.

When a positive bias is applied to the anode and the gate electrode 96, the depletion mode NMOS2 98 will inject electrons into the N-drift region of the thyristor and trigger the thyristor into the latching state. The latching current flows into the N$^+$ emitter of the thyristor and then flows into the cathode 102 through the FOC metal strap 104 and the series NMOS1 92. The LNECT's forward voltage drop is therefore that of a thyristor plus that of the NMOS1 92. With the increase of the current, the voltage at the FOC metal strap 104, $V_m$, will increase, the PMOS 100 will be turned 'on' and hole currents will be diverted from the P base through the PMOS 100 into the cathode 102. Consequently, the turn-on of the PMOS 100 will reduce the NPN transistor's current gain. If the reduction of the NPN transistor current gain, $\Delta\alpha_{npn}$ cannot be compensated by an increase of the PNP transistor current gain, $\Delta\alpha_{pnp}$ so that $$\alpha_{npn0}+\alpha_{pnp0}-\Delta\alpha_{npn}+\Delta\alpha_{pnp} \leq 1 \quad (4)$$

then the LNECT will come out of latching state. If this happens, the current flowing through the PMOS 100 will tend to decrease, and so will the $V_m$. A reduced $V_m$ means a reduction of the diverted current through the PMOS 100 and the decrease of the $\Delta\alpha_{npn}$ hence the LNBCT enters latching again. Such negative feedback mechanism, therefore, leads to the fact that the main thyristor can only operate at the breakover boundaries of the latching condition with the NPN transistor operating in the active region. Under this condition, the anode 106 voltage $V_A$ continues to increase without significant anode current increase, and the increased anode voltage is supported by the main junction J2. and the LNECT has a high voltage current saturation capability.

The LNECT can be turned-off by decreasing the gate electrode 108 voltage to zero or negative to turned 'off' the NMOS1 92, which interrupts the main current flow path, and all currents are then forced to divert to the cathode by the PMOS 100. Moreover, both emitter switch and emitter short are used in the turn-off of the LNECT, no parasitic thyristor limits the Reverse Bias SOA (RBSOA) of the LNECT.

Figure 5B:
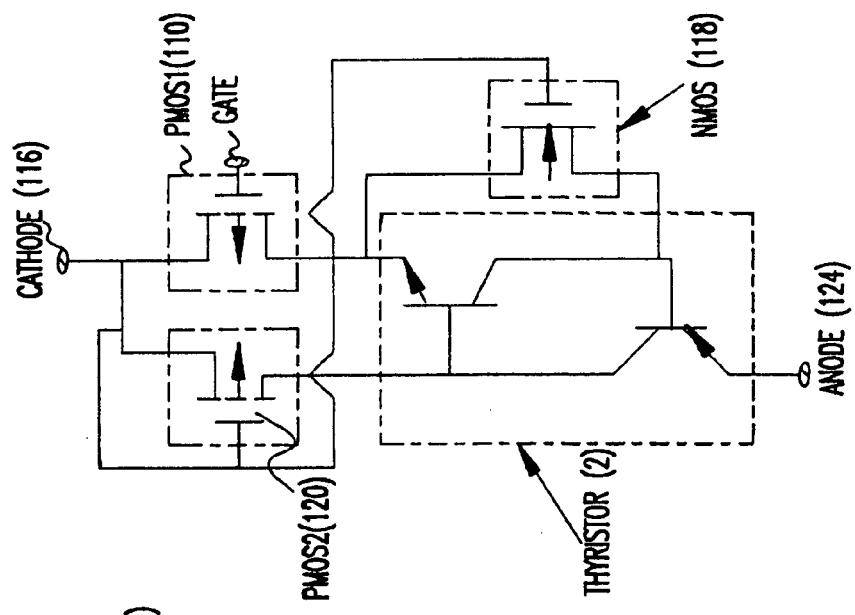
FIGS. 5A and 5B are a cross-sectional view of a lateral emitter controlled thyristor (LECT) and its circuit equivalent, respectively.
Figure 5A:
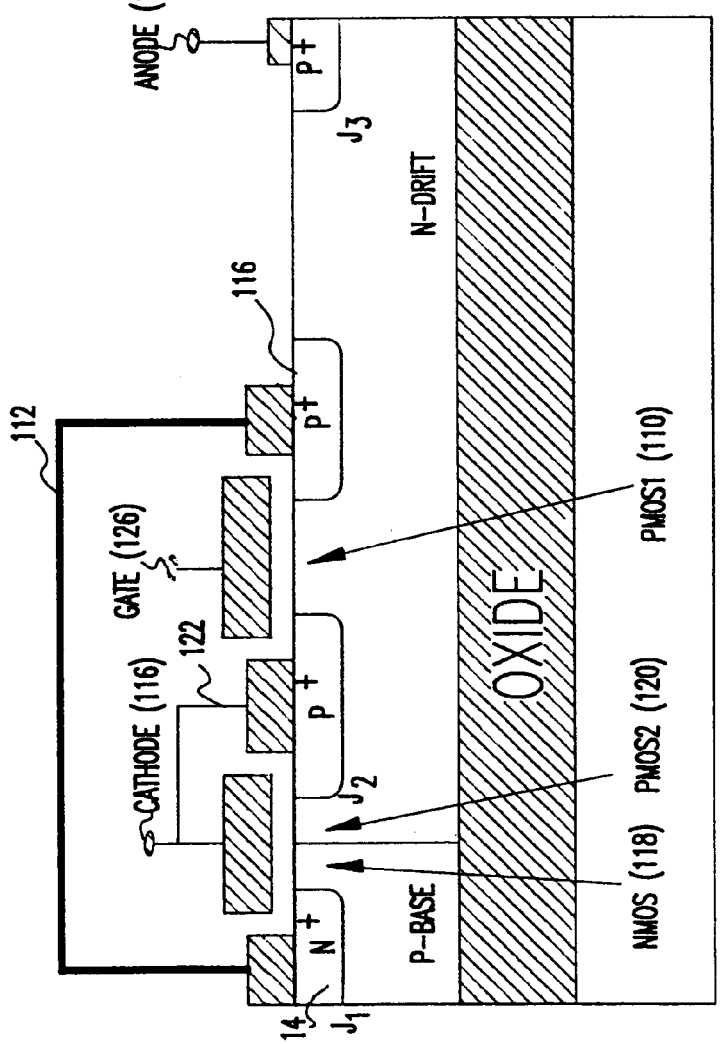

Referring now to FIGS. 5A–B, there is shown a cross-sectional view of the another variation of the LECT (LECT-1) and its equivalent circuit, respectively. The LECT-1 has a lateral 4-layer P$^+$-N-P-N$^+$ thyristor structure 2, in series with a P channel MOSFET (PMOS1) 110 integrated on the surface of the N layer through a Floating Ohmic Contact (FOC) metal strap 112. The FOC 112 connects the upper N$^+$ emitter 114 of the PNPN thyristor and the P+ source region 116 of the PMOS1 110. The FOC 112 provides the bridge for transferring emitter electron currents of the NPN transistor into hole currents, which then flow through the PMOS1 110 channel and into the cathode contact 116. An N-channel depletion mode MOSFET (NMOS) 118 is also integrated at the surface of the LECT-1 which acts as the turn-on MOSFET. A second PMOSFET (PMOS2) 120 is formed between the P base and the P drain of the PMOS1 110 with the P base acting as its source. The NMOS 118 and the PMOS2 120 share the same gate 122, and the gate is directly tied to the cathode contact 116, hence, the LECT-1 is a three-terminal device.

When a positive bias is applied to the anode 124 and a negative gate voltage is applied to the gate electrode 126, the depletion mode NMOS 118 will inject electrons into the n-drift region of the thyristor and trigger the thyristor into the latching state. The latching current flows into the N$^+$ emitter of the thyristor and then flows into the cathode 116 through the FOC metal strap 112 and the series PMOS1 110. The LECT-1's forward voltage drop is therefore that of a thyristor plus that of the PMOS1 110. With the increase of the current, the voltage at the FOC metal strap 112, $V_m$, will increase, the PMOS2 120 will be turned 'on' and hole currents will be diverted from the P base through the PMOS2 120 into the cathode 116. Consequently, the turn-on of the PMOS2 120 will reduce the NPN transistor's current gain. If the reduction of the NPN transistor current gain, $\Delta\alpha_{npn}$, cannot be compensated by an increase of the PNP transistor current gain, $\Delta\alpha_{pnp}$ so that $$\alpha_{npn0}+\alpha_{pnp0}-\Delta\alpha_{npn}+\Delta\alpha_{pnp} \leq 1 \quad (5)$$

then the LECT-1 will come out of latching state. If this happens, the current flowing through the PMOS2 120 will tend to decrease, and so will the $V_m$. A reduced $V_m$ means a reduction of the diverted current through the PMOS2 120 and the decrease of the $\Delta\alpha_{pnp}$, hence, the LECT-1 enters latching again. Such negative feedback mechanism, therefore, leads to the fact that the main thyristor can only operate at the breakover boundaries of the latching condition with the NPN transistor operating in the active region. Under this condition, the anode voltage $V_A$ continues to increase without significant anode current increase, and the increased anode voltage is supported by the main junction J2. and the LECT-1 has a high voltage current saturation capability.

The LECT-1 can be turned-off by increasing the gate electrode 126 voltage to zero or positive to turned 'off' the PMOS1 110, which interrupts the main current flow path, and all currents are then forced to divert to the cathode 116 by the PMOS2 120. Moreover, both emitter switch and emitter short are used in the turn-off of the LECT-1, no parasitic thyristor limits the Reverse Bias SOA (RBSOA) of the LECT-1.

Figure 6B:
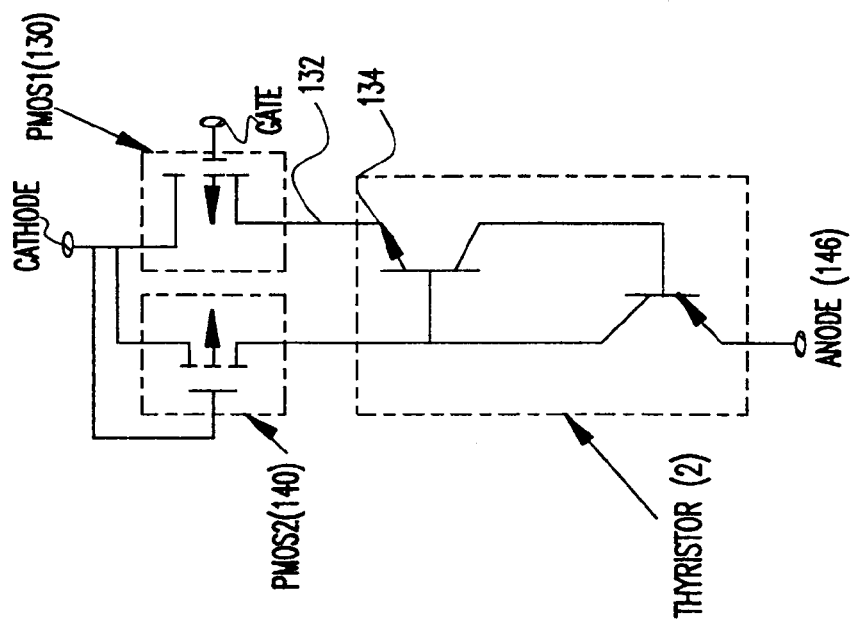
FIGS. 6A and 6B are a cross-sectional view of an alternate embodiment of the ECT shown in FIGS. 1A–B with a metal connection and its circuit equivalent, respectively.
Figure 6A:
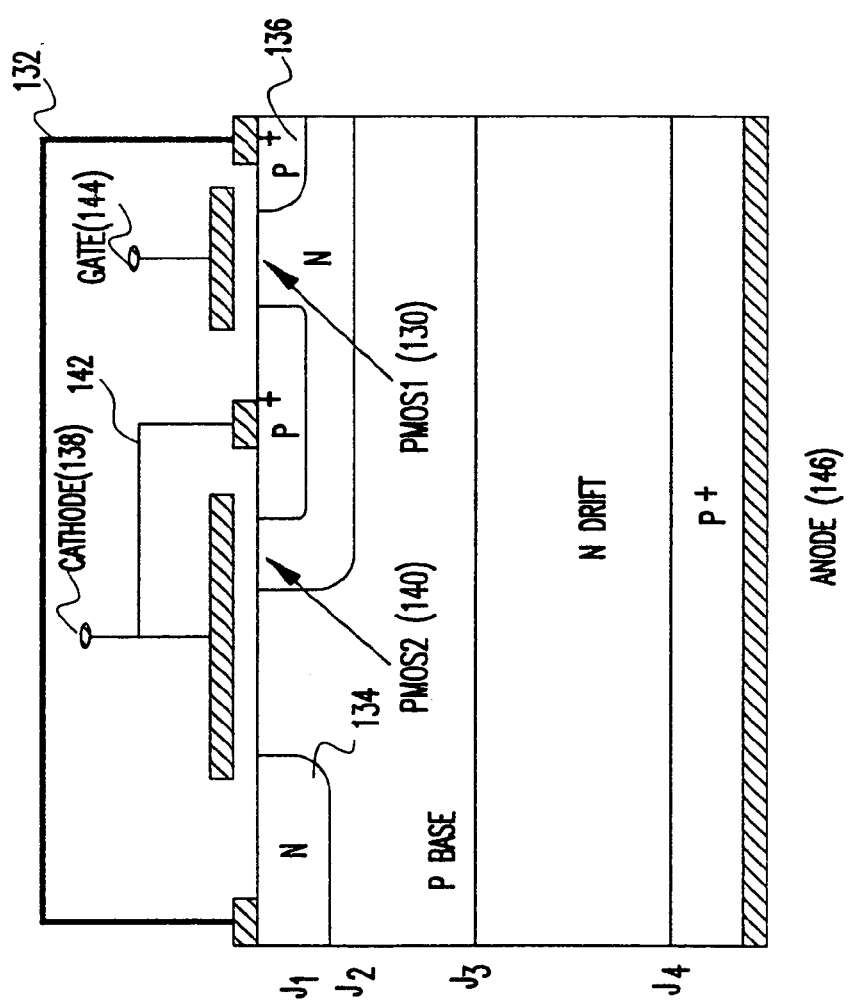

Referring now to FIGS. 6A–6B, there is shown a cross sectional view of a emitter controlled thyristor with a metal connection (ECT-MC) and its equivalent circuit, respectively. The ECT-MC has a 4-layer P$^+$-N-P-N$^+$ thyristor structure 2 in series with a P channel MOSFET (PMOS1) 130 integrated on the top N layer through a metal strap 132. This metal strap 132 shorting the N$^+$ emitter 134 and the P$^+$ region 136 which acts as the source of the PMOS1 130. And the metal strap 132 provides the bridge for transferring emitter electron currents of the upper NPN transistor into hole currents, which then flow through the PMOS1 130 channel and into the cathode contact 138. A second PMOS-FET (PMOS2) 140 is formed at the other side of the cathode contact 138 with the upper P base acting as the source. The PMOS2 140 does not have a separate control gate, instead, its gate 142 is tied to the cathode contact 138.

The operation mechanism of the ECT with a metal-connection 132 is similar as that of the ETC. During the forward current conduction, a large negative gate voltage is applied to the main gate 144, the ECT-MC current flows vertically along the PNPN thyristor structure, and then laterally flows through the series PMOS1 130 and into the cathode 138. The ECT-MC's forward voltage drop is therefore that of a thyristor plus that of the PMOS1 130. With the increase of the current, the voltage of the metal strap 132, $V_m$, will increase due to the channel resistance of the PMOS1 130. When $V_m>`V_{T2}$, where $V_{T2}<0$ is the threshold voltage of the PMOS2 140, the PMOS2 140 turns 'on', and hole currents will be diverted from the upper base through the PMOS2 140 into the cathode 138. The turn-on of the PMOS2 140 will reduce the upper NPN transistor's current gain. If the reduction of the upper NPN transistor current gain, $\Delta\alpha_{npn}$, cannot be compensated by an increase of the lower PNP transistor current gain, $\Delta 60_{pnp}$ so that $$\alpha_{npn0}+\alpha_{pnp0}-\Delta\alpha_{npn}+\Delta\alpha_{pnp} \leq 1 \quad (6)$$

then the ECT-MC will come out of latching state. If this happens, the current flowing through the PMOS1 130 will tend to decrease, and so will the $V_m$. A reduced $V_m$ means a reduction of the diverted current through the PMOS2 140 and the decrease of the $\Delta\alpha_{npn}$ hence the ECT-MC enters latching again. Such negative feedback mechanism, therefore, leads to the fact that the main thyristor can only operate at the breakover boundaries of the latching condition with the NPN transistor operating in the active region. Under this condition, the anode voltage $V_A$ continues to increase without significant anode 146 current increase, and the increased anode voltage is supported by the main junction J3. The lower PNP transistor (also operating in the active region) supplies base current for the upper NPN transistor, and the saturation current is the holding current of the thyristor with both PMOS1 130 and PMOS2 140 conducting. At very high voltages, the increase of $\Delta\alpha_{pnp}$ will compensate $\Delta\alpha_{npn}$, and the ECT-MC will tend to latch again until equation (6) is violated. The violation point can be considered to correspond to the ECT-MC's FBSOA boundary point.

The ECT-MC can be turned-off by increasing the gate electrode voltage to zero or positive value in the PMOS1 130, which interrupts the main current flow path. All currents are then forced to divert to the cathode by the PMOS2 140. Both emitter switch (PMOS1) 130 and emitter short (PMOS2) 140 are used in the turn-off of the ECT-MC, and unlike in the EST, no parasitic thyristor limits the RBSOA of the ECT-MC.

Figure 7B:
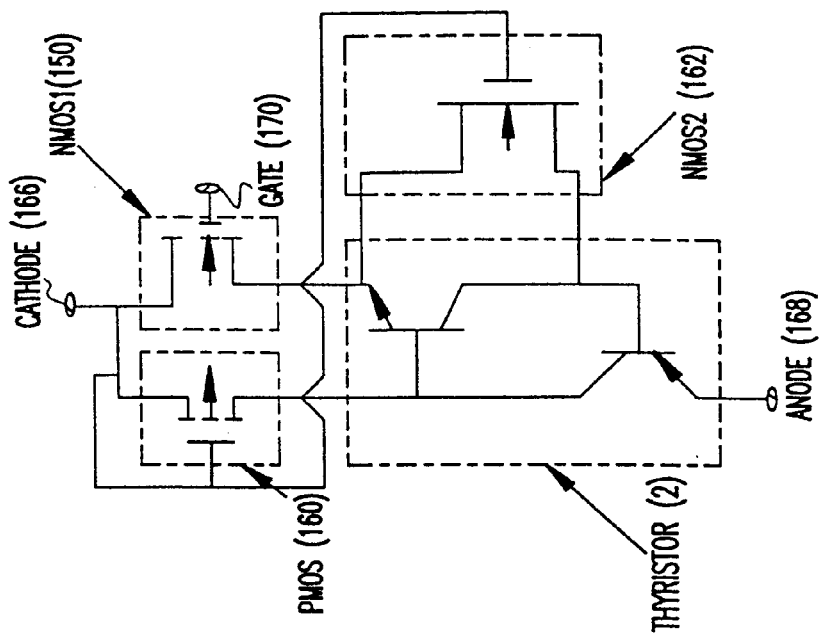
FIGS. 7A and 7B are a cross-sectional view of a single gate NMOS emitter controlled thyristor (SNECT) and its circuit equivalent, respectively.
Figure 7A:
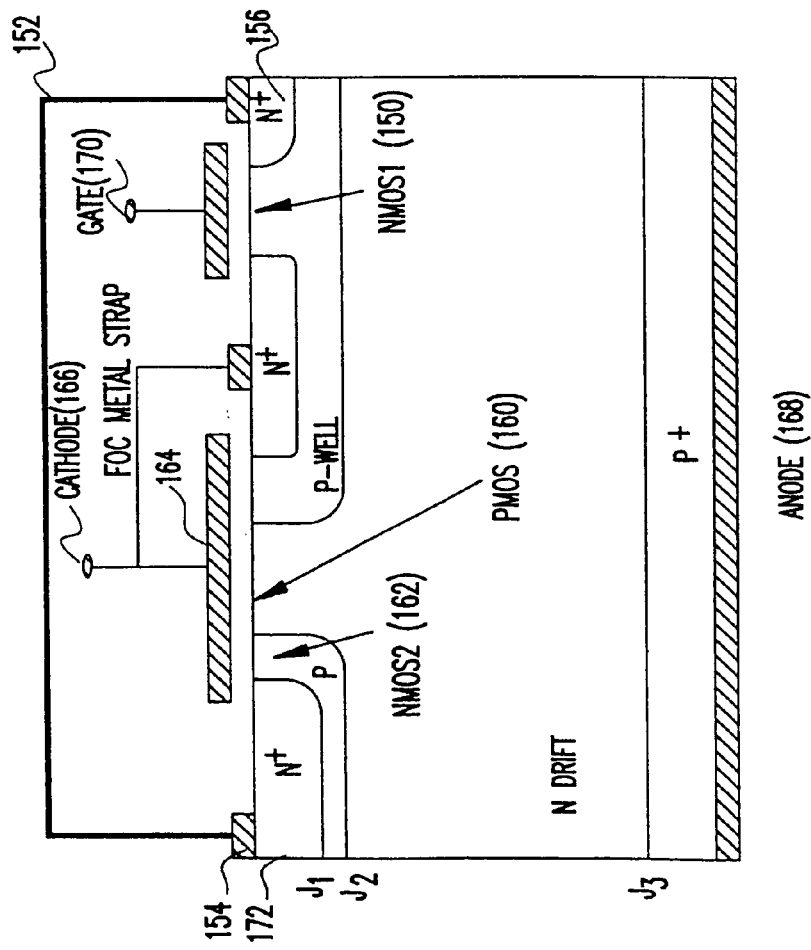

Referring now to FIGS. 7A–B, there is shown a cross-sectional view of the Single Gate NMOS ECT (SNECT) and its equivalent circuit, respectively. The SNECT has a 4-layer PNPN thyristor structure 2 in series with a N channel MOSFET (NMOS 1) 150 integrated on the top of the P well through a Floating Ohmic Contact (FOC) metal strap 152. The FOC 152 connects the upper N+ emitter 154 of the PNPN thyristor and the N+ drain region 156 of the NMOS 1. An N-channel depletion mode MOSFET (NMOS2) 162 is also integrated at the surface of the SNECT which acts as the turn-on MOSFET. A P-channel MOSFET (PMOS) 160 is formed between two P regions. The NMOS2 162 and the PMOS 160 share the same gate 164, and the gate is directly tied to the cathode contact 166; hence, the SNECT is a three-terminal device.

When a positive bias is applied to the anode 168 and a positive gate voltage is applied to the gate electrode 170, the depletion mode NMOS1 150 will inject electrons into the n-drift region of the thyristor and trigger the thyristor into the latching state. The latching current flows into the upper N emitter 172 of the thyristor and then flows laterally into the cathode through the FOC metal strap 152 and the series NMOS1 150. The SNECT's forward voltage drop is therefore that of a thyristor plus that of the PMOS 160. With the increase of the current, the voltage at the FOC metal strap 152, $V_m$, will increase, the PMOS 160 will be turned 'on' and hole currents will be diverted from the upper base of the NPN transistor through the PMOS 160 into the cathode 166. Consequently, the turn-on of the PMOS 160 will reduce the upper NPN transistor's current gain. If the reduction of the upper NPN transistor current gain, $\Delta\alpha_{pnp}$, cannot be compensated by an increase of the lower PNP transistor current gain, $\Delta\alpha_{npn}$, so that $$\alpha_{npn0}+\alpha_{pnp0}-\Delta\alpha_{npn}+\Delta\alpha_{pnp} \leq 1 \quad (7)$$

then the SNECT will come out of latching state. If this happens, the current flowing through the PMOS 160 will tend to decrease, and so will the $V_m$. A reduced $V_m$ means a reduction of the diverted current through the PMOS 160 and the decrease of the $\Delta\alpha_{npn}$ hence, the SNECT enters latching again. Such negative feedback mechanism, therefore, leads to the fact that the main thyristor can only operate at the breakover boundaries of the latching condition with the NPN transistor operating in the active region. Under this condition, the anode voltage VA continues to increase without significant anode current increase, and the increased anode voltage is supported by the main junction J2. and the SNECT has a high voltage current saturation capability.

The SNECT can be turned-off by decreasing the gate electrode 170 voltage to zero or negative to turned 'off' the NMOS1 150, which interrupts the main current flow path, and all currents are then forced to divert to the cathode 166 by the PMOS 160. Moreover, both emitter switch and emitter short are used in the turn-off of the SNECT, no parasitic thyristor limits the Reverse Bias SOA (RBSOA) of the SNECT.

Figures 8A, 8B:
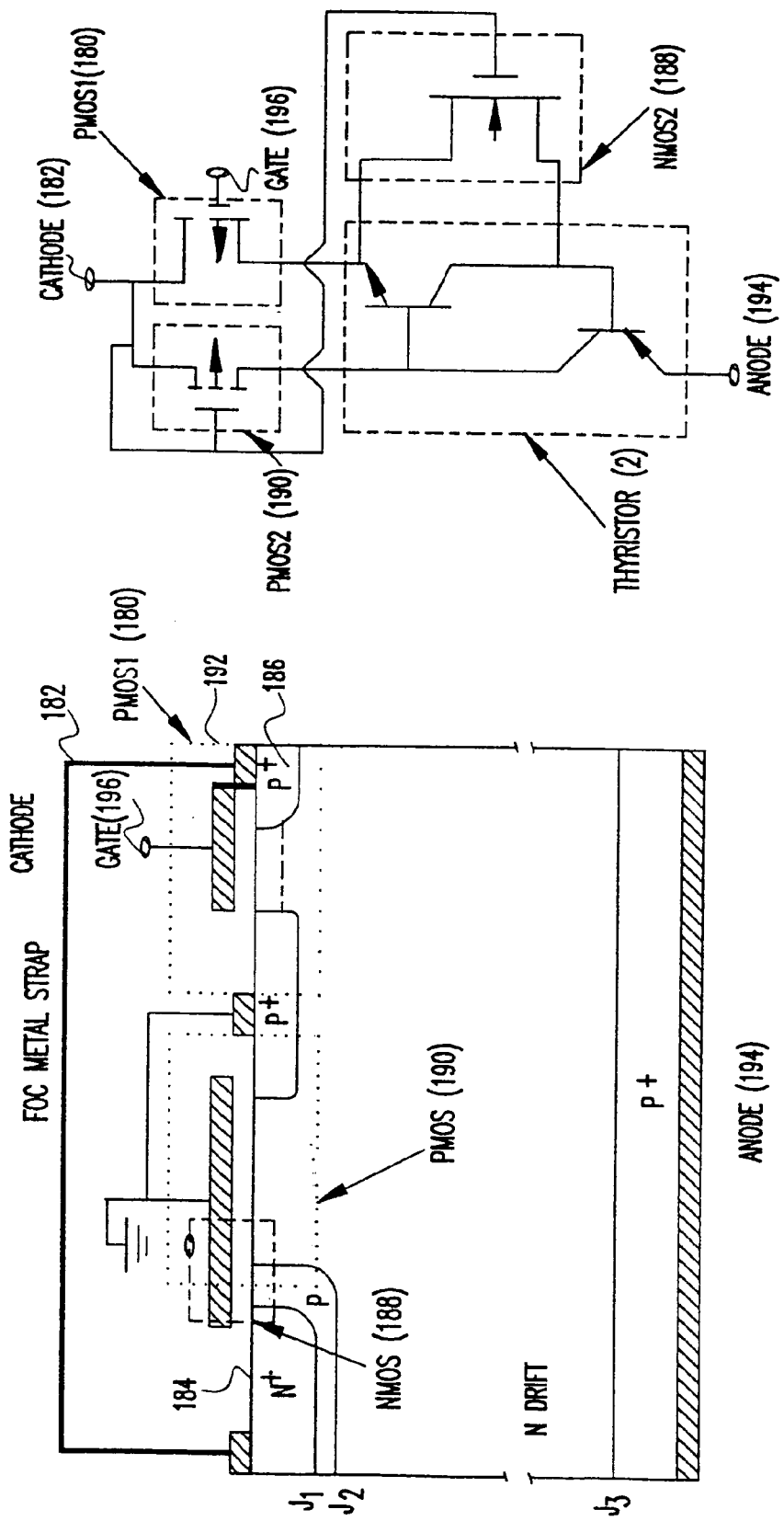
FIGS. 8A and 8B are a cross-sectional view of a single gate emitter controlled thyristor (SECT) and its circuit equivalent.

Referring now to FIGS. 8A–B, there is shown a cross-sectional view of a single gate emitter controlled thyristor SECT and its circuit equivalent, respectively. The SECT has a 4-layer PNPN thyristor structure 2 in series with a P channel MOSFET (PMOS1) 180 integrated on the surface of the N substrate through a Floating Ohmic Contact (FOC) metal strap 182. The FOC 182 connects the upper N+ emitter 184 of the PNPN thyristor and the P source region 186 of the PMOS1 180. The FOC 182 provides the bridge for transferring emitter electron currents of the upper NPN transistor into hole currents, which then flow through the PMOS1 180 channel and into the cathode contact. An N-channel depletion mode MOSFET (NMOS) 188 is also integrated at the surface of the SECT which acts as the turn-on MOSFET. A second PMOSFET (PMOS2) 190 is formed between the turn-on NMOS 188 and the PMOS1 180 with the upper P base acting as its source. The NMOS 188 and the PMOS2 190 share the same gate, and the gate is directly tied to the cathode contact 192, hence, the SECT is a three-terminal device.

When a positive bias is applied to the anode 194 and a negative gate voltage is applied to the gate electrode 196, the depletion mode NMOS will inject electrons into the n-drift region of the thyristor and trigger the thyristor into the latching state. The latching current flows into the upper N emitter of the thyristor and then flows laterally into the cathode through the FOC metal strap 182 and the series PMOS1 180. The SECT's forward voltage drop is therefore that of a thyristor plus that of the PMOS1 180. With the increase of the current, the voltage at the FOC metal strap 182, $V_m$, will increase, the PMOS2 190 will be turned 'on' and hole currents will be diverted from the upper base through the PMOS2 190 into the cathode 192. Consequently, the turn-on of the PMOS2 190 will reduce the upper NPN transistor's current gain. If the reduction of the upper NPN transistor current gain, $\Delta\alpha_{npn}$ cannot be compensated by an increase of the lower PNP transistor current gain, $\Delta\alpha_{pnp}$, so that $$\alpha_{npn0}+\alpha_{pnp0}-\Delta\alpha_{npn}+\Delta\alpha_{pnp} \leq 1 \quad (8)$$

then the SECT will come out of latching state. If this happens, the current flowing through the PMOS2 190 will tend to decrease, and so will the $V_m$. A reduced $V_m$ means a reduction of the diverted current through the PMOS2 190 and the decrease of the $\Delta\alpha_{npn}$ hence the SECT enters latching again. Such negative feedback mechanism, therefore, leads to the fact that the main thyristor can only operate at the breakover boundaries of the latching condition with the NPN transistor operating in the active region. Under this condition, the anode voltage $V_A$ continues to increase without significant anode current increase, and the increased anode voltage is supported by the main junction J2. and the SECT has a high voltage current saturation capability.

The SECT can be turned-off by increasing the gate electrode voltage to zero or positive to turned 'off' the PMOS1 180, which interrupts the main current flow path, and all currents are then forced to divert to the cathode 182 by the PMOS2 190. Moreover, both emitter switch and emitter short are used in the turn-off of the SECT, no parasitic thyristor limits the Reverse Bias SOA (RBSOA) of the SECT.

Referring now to FIGS. 9A and 9B there is shown a cross-sectional view of an emitter turn off thyristor (ETO) and its equivalent circuit, respectively. The ETO comprises a PNPN thyristor 202 and an emitter switch 200. MOSFETs or other MOS gated devices are used to build the emitter switch 200. The thyristor 202 can be a GTO or SCR device. The specially selected MOS gated device have their minimum forward voltage at high current. To turn off the thyristor 202, simply turn-off the emitter-devices by dropping the voltage at the gate 204 to zero. As shown by the arrows, in order to turn the thyristor on, the MOS switch 200 turns on and the thyristor gate injects current. In order to turn the thyristor off, MOS switch 204 is turned off and the thyristor gate B drains current.

Figure 10B:
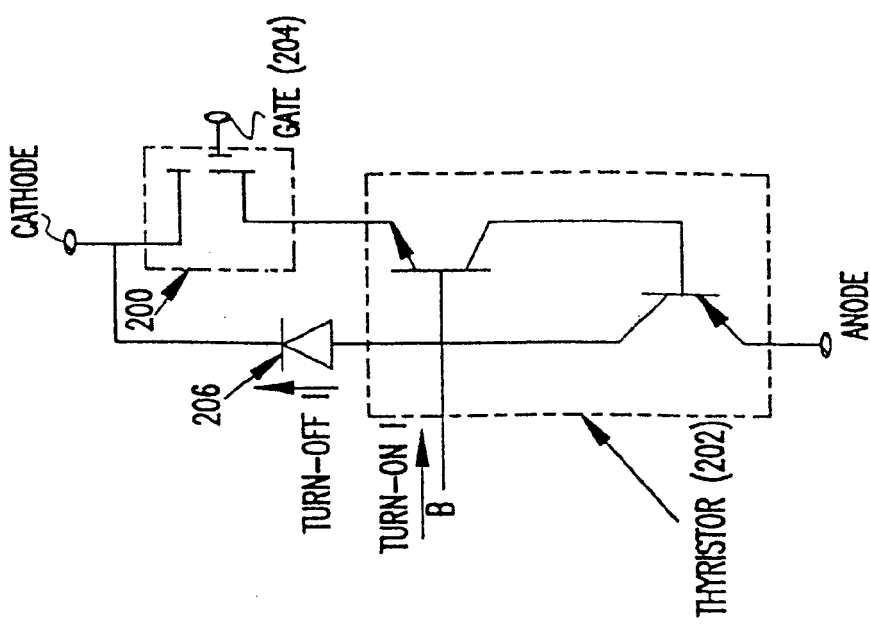
FIGS. 10A and 10B are a cross-sectional view of an alternate emitter turn off thyristor (ETO) and its equivalent circuit.
Figure 10A:
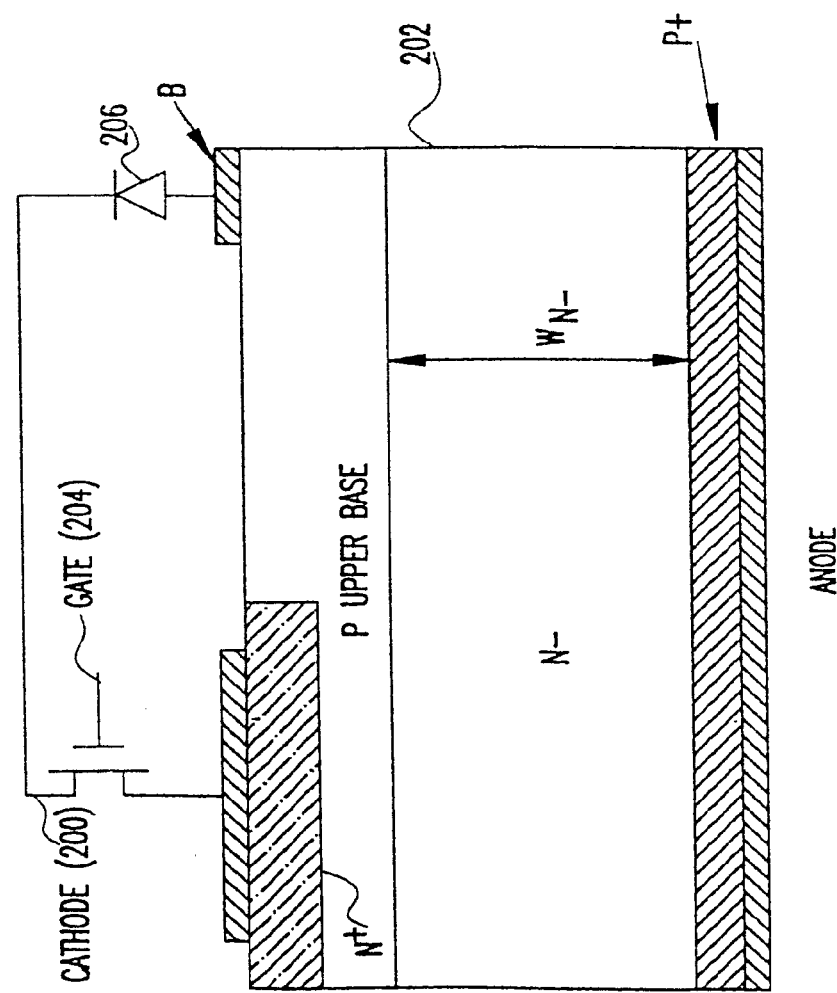

Referring now to FIGS. 10A and B there is shown a cross-sectional view of an improved emitter turn off thyristor (ETO) and its equivalent circuit, respectively. The circuit is similar to the one shown in FIGS. 9A–B with the addition of a diode 206 connected between the thyristor gate B and the cathode terminal. The threshold voltage of the diode 206 selected is higher than the voltage drop across the thyristor gate to cathode plus the voltage of the emitter-switch 200 in an on-state. When the thyristor 202 is going to be turned on or in on state, the thyristor gate B voltage is always lower than that of the gate switch's 204 threshold voltage, the gate-switch 204 acts as open circuit. During the turn-off transient process, the emitter-switch 200 is off and can not conduct current. The diode 206 provides a path for the anode current to flow at turn-off and terminal B can be an open circuit.

Figure 11B:
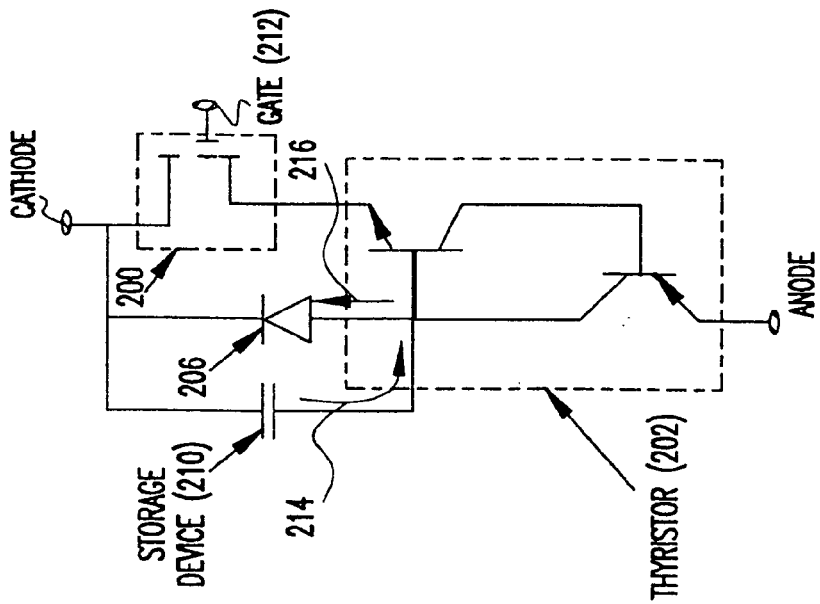
FIGS. 11A and 11B are a cross-sectional view of an alternate emitter turn off thyristor (ETO) and its circuit equivalent, respectively.
Figure 11A:
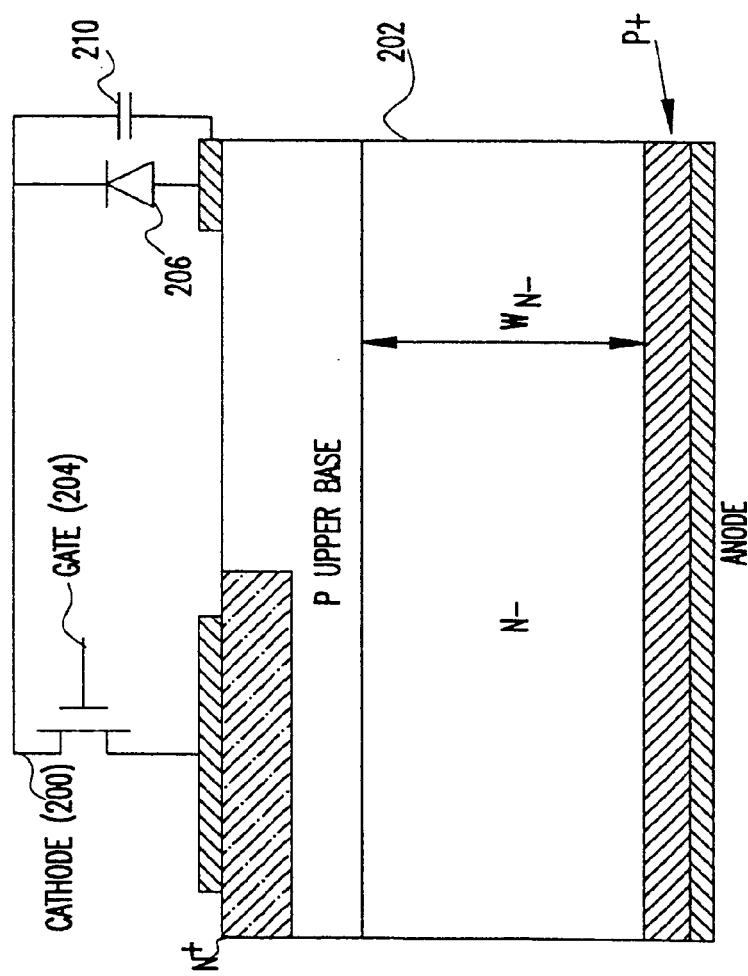

Referring now to FIGS. 11A and 11B, there is shown a cross-sectional view of an emitter turn off thyristor (ETO) and its equivalent circuit. The circuit is similar to that shown in FIGS. 10A–B with the addition of a capacitor 210 connected in parallel to the diode 206. The capacitor 210 is used to help turn on the thyristor 202 by providing an alternative turn-on current for the thyristor gate B as shown by the arrow 214. The voltage of the capacitor 210 is clamped to the threshold voltage of the diode 206. To turn-on the ETO, the emitter-switch 200 is turned on and the capacitor 210 discharges through the thyristors gate-cathode and emitter-switch path. The discharge current acts as the turn on current for the thyristor 202. The capacitor 210 is charged during the turn-off transient when the anode current flows out of the thyristor gate B as shown by the arrow 216. With the structure describe above, the thyristor 202 is fully a MOS controlled device. It is turned on by adding a voltage on the MOS emitter-switch MOS gate 212. It is turned off by removing that voltage.

Figure 12B:
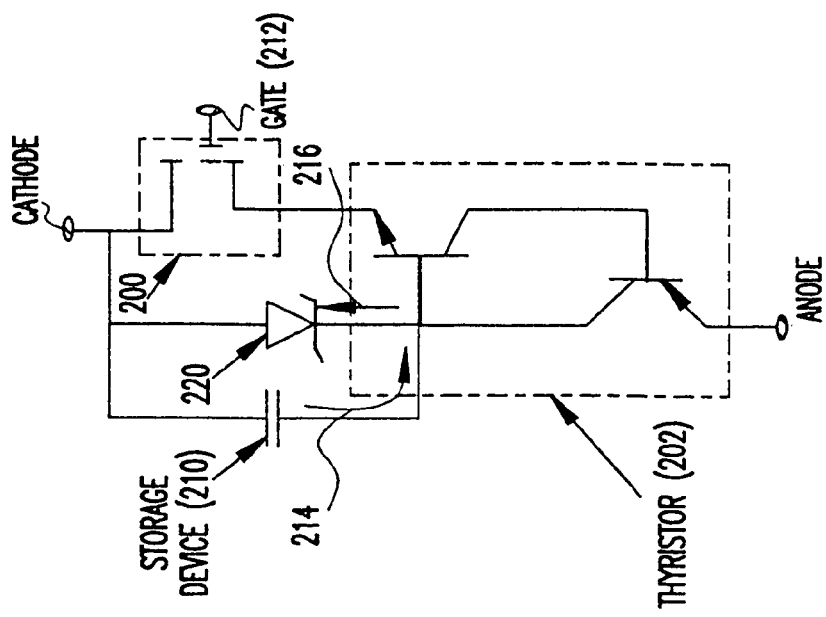
FIGS. 12A and 12B are a cross-sectional view of an alternate emitter turn off thyristor (ETO) and its equivalent circuit, respectively.
Figure 12A:
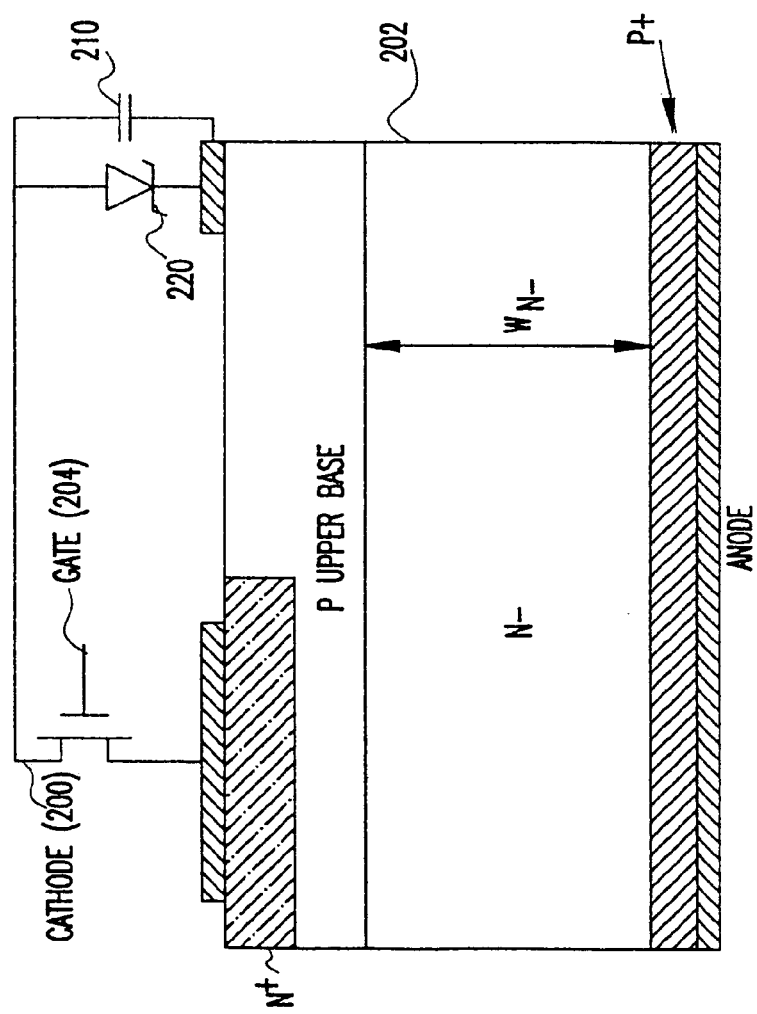

Referring now to FIGS. 12A and 12B there is shown a cross-sectional view of an improved emitter turn off thyristor (ETO) and its circuit equivalent, respectively. This circuit is similar to the one described with reference to FIGS. 11A–B, above, with the diode 206 being replaced with a Zener diode 220. Zener diodes are easier to achieve higher turn-on voltage than a diode; hence more energy can be stored. To turn on the thyristor, the MOS emitter switch 200 is turned on and the capacitor 210 injects current into the thyristor gate B as shown by arrow 214. For turn-off, the MOS emitter switch 200 is turned off and the Zener diode 220 drains current to charge the capacitor 210 as shown by arrow 216.

Figure 13B:
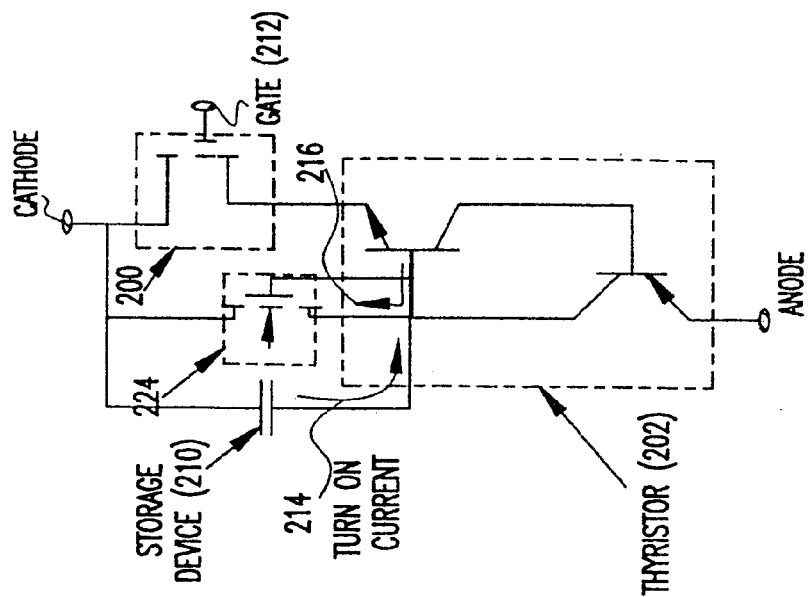
FIGS. 13A and 13B are a cross-sectional view of an alternate emitter turn off thyristor (ETO) and its circuit equivalent, respectively.
Figure 13A:
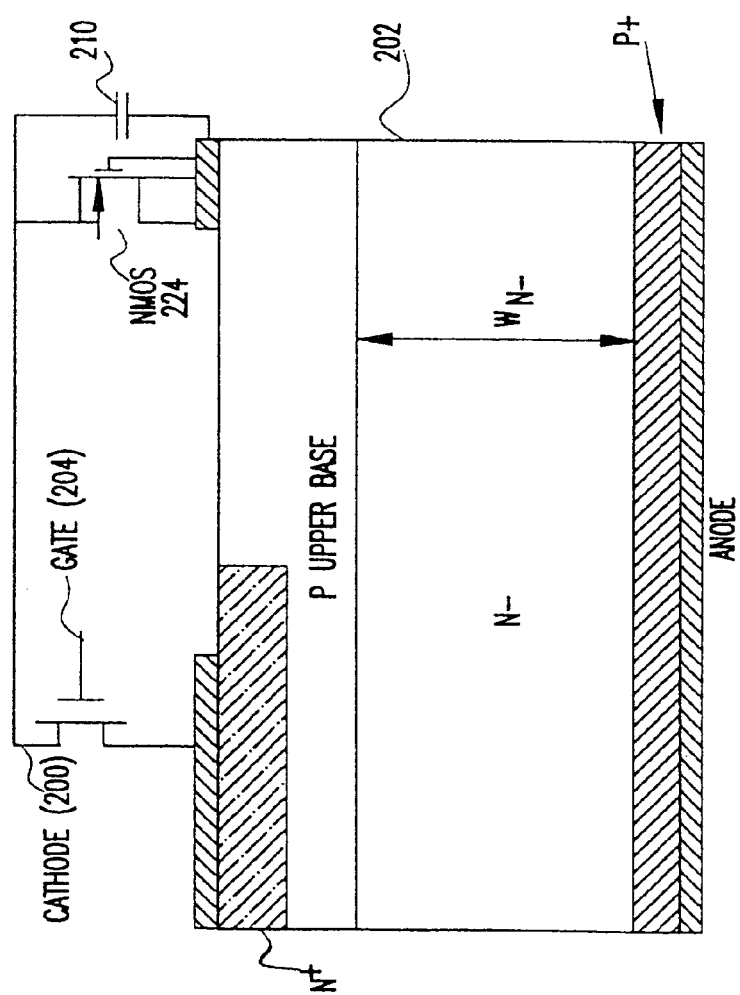

Referring now to FIGS. 13A and 13B there is shown a cross-sectional view of an emitter turn off thyristor (ETO) and its equivalent circuit, respectively. In this structure, two N-channel MOSFETs 200 and 224, one for the emitter switch and one for the gate switch, are used. The NMOS 224 has its drain and gate terminals connected together and can functions as the Zener diode discussed above but can handle higher currents. As before, for to turn on the thyristor, the MOS emitter switch 200 is turned on and the capacitor 210 injects current into the thyristor gate B as shown by arrow 214. For turn-off, the MOS emitter switch 200 is turned off the NMOS 224 drains current to charge the capacitor 210 as shown by arrow 216.

Figure 14B:
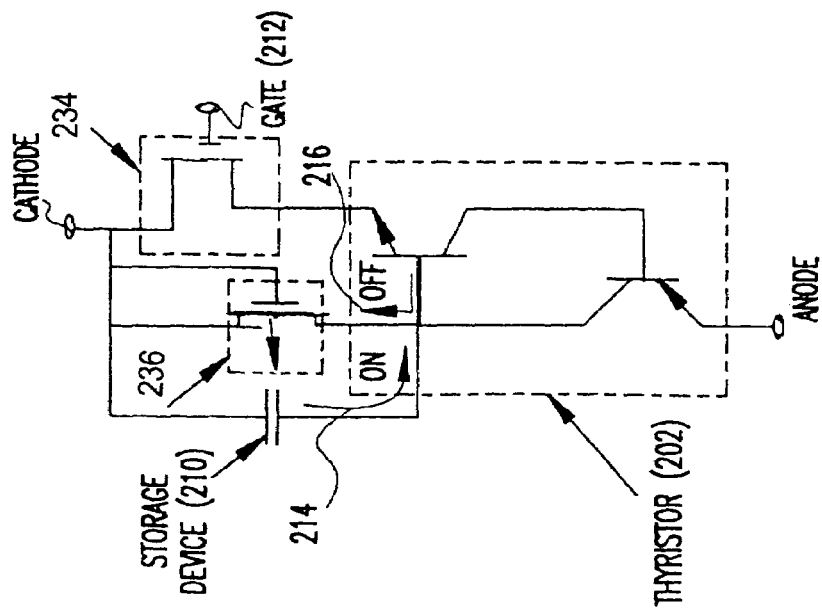
FIGS. 14A and 14B are a cross-sectional view of an alternate emitter turn off thyristor (ETO) and its equivalent circuit, respectively.
Figure 14A:
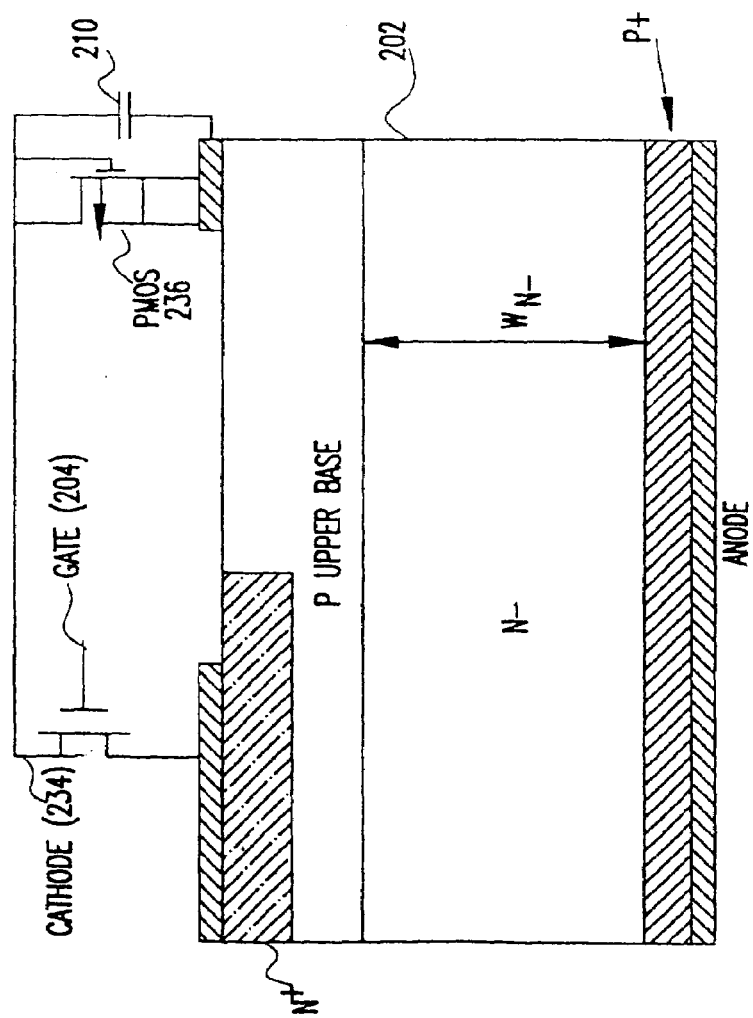

Referring now to FIGS. 14A and 14B, there is shown an emitter turn off thyristor (ETO) and its equivalent. This circuit is similar to the circuit shown above with reference to FIGS. 13A–B excepts the NMOS transistors are replaced with PMOS transistors 234 and 236. The PMOS 236 has its gate and drain terminals tied together. Compared to that of NMOS transistors, the PMOS transistors 234 and 236 drain is connected directly to the cathode terminal.

Figure 15B:
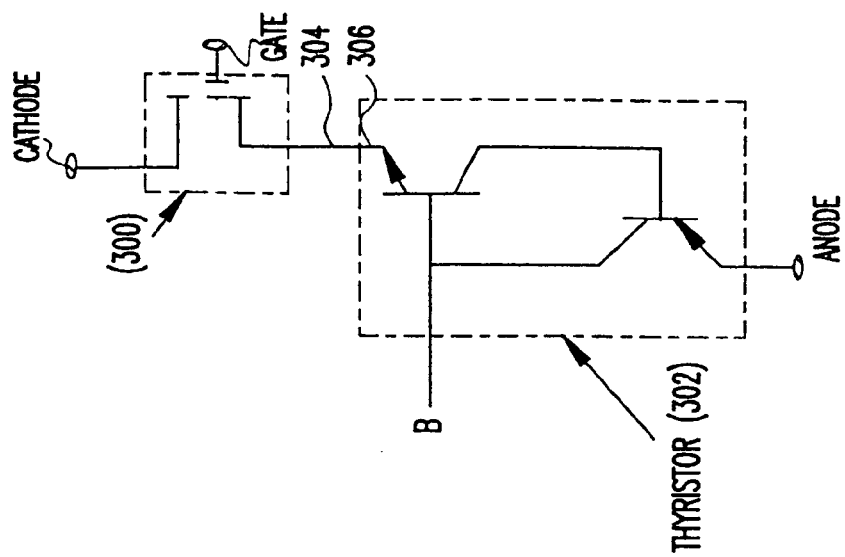
FIGS. 15A and 15B are a cross-sectional view of a package that attaches to a MOSFET die on a single emitter finger of the GTO and its equivalent circuit, respectively, similar to that shown in FIG. 9.
Figure 15A:
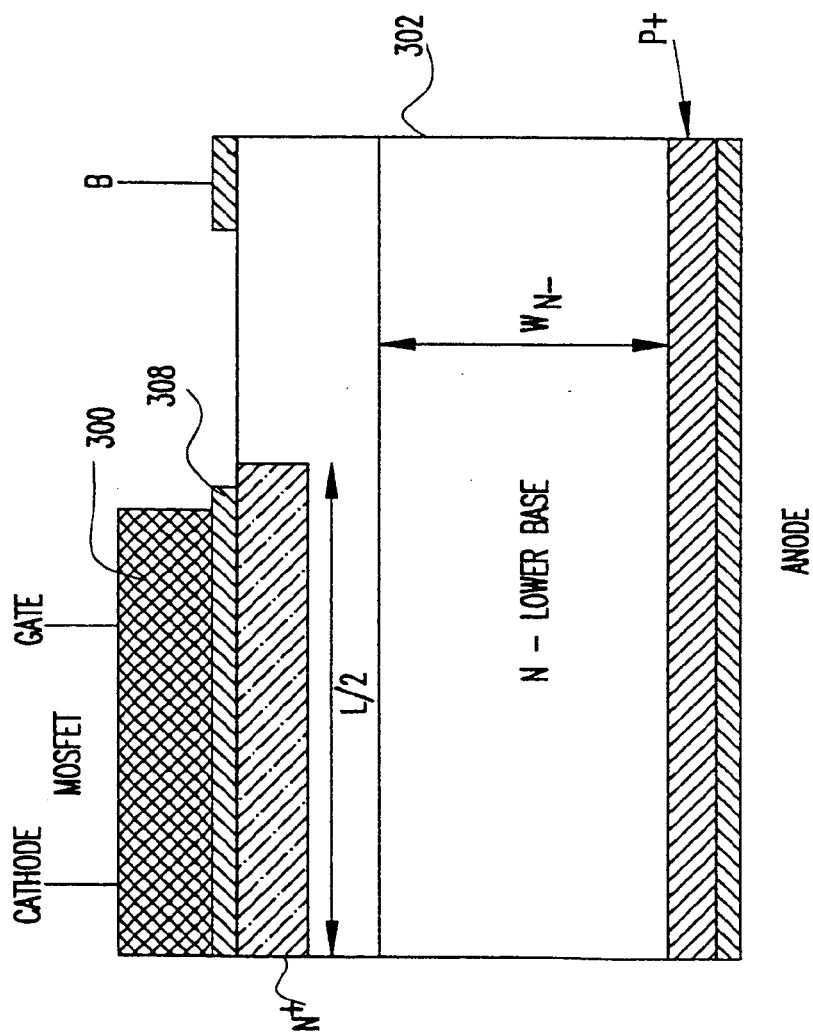

Referring now to FIGS. 15A and 15B there is shown a cross-sectional view of an emitter turn-off thyristor that attach a MOSFET die on a single emitter finger of the thyristor or GTO, and its equivalent circuit, respectively. To realize this ETO thyristor, the emitter-switch along with the gate-switch is packaged along with a gate-turn off thyristor. (GTO) 302. As shown, an N-MOSFET die 300, acting as the emitter switch, is mounted on the cathode K of the GTO's die 302. The drain 304 of the NMOS device contacts directly with the cathode 306 of the GTO 302 with a metal strip 308. The source of the NMOS device becomes the cathode K of the ETO. By mounting the emitter-switch onto the GTO in the die form, the size of the ETO is minimized. Further, stray inductance between their connection is minimized.

Figure 16B:
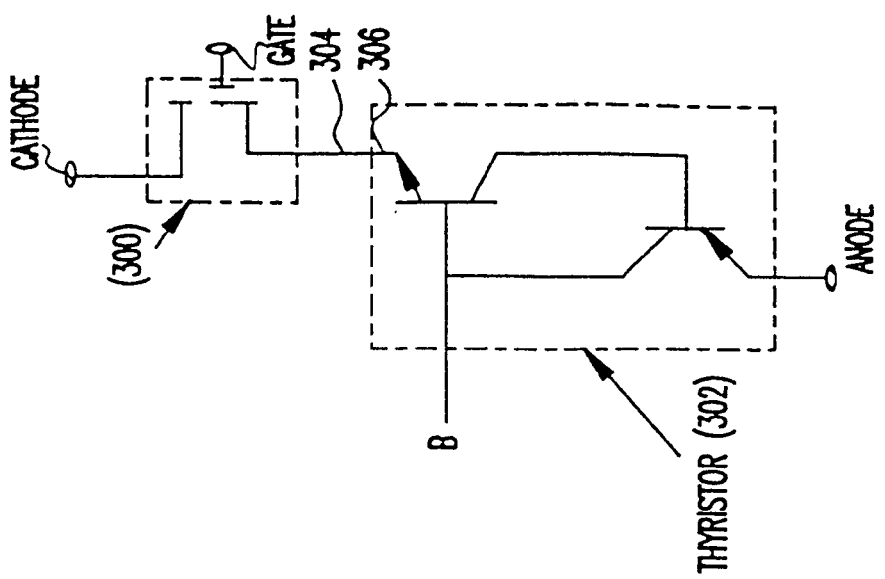
FIGS. 16A and 16B are a cross-sectional view of a package that attaches to a MOSFET die on multiple emitter fingers of the GTO and equivalent circuit, respectively, similar to that shown in FIG. 9 but having multiple emitter fingers in the active area.
Figure 16A:
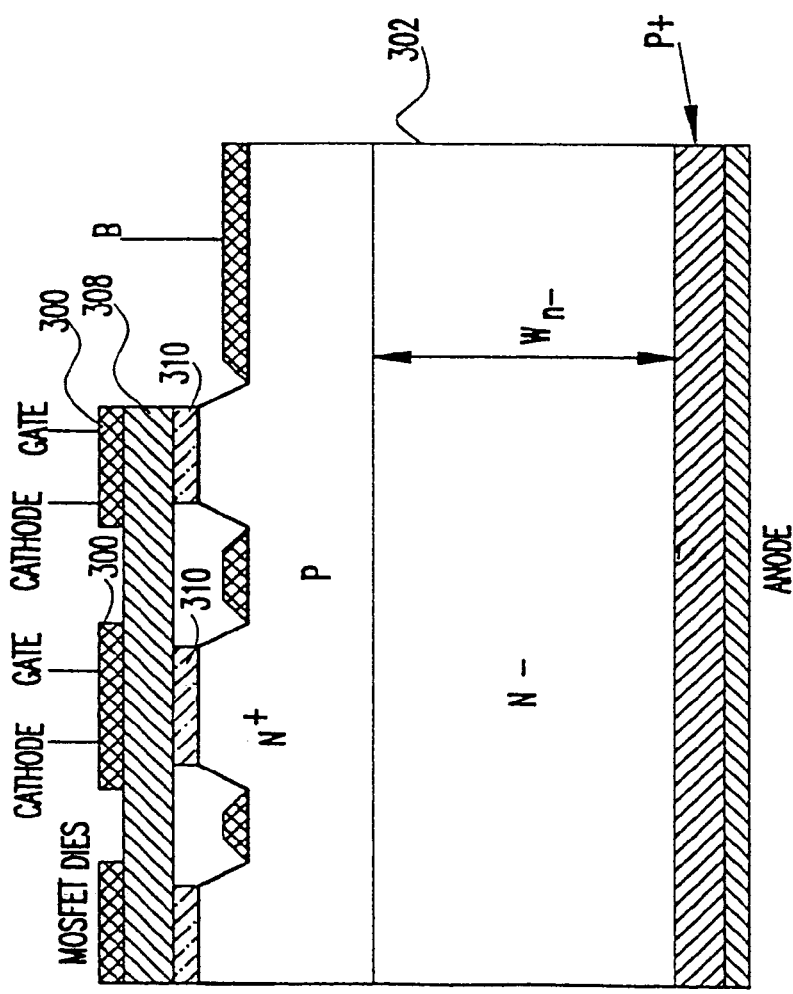

Referring now to FIGS. 16A and 16B there is shown a cross-sectional view of an ETO that attaches a multiple die form MOSFET on multiple emitter fingers and its circuit equivalent, respectively. In this structure, both the N-MOS devices 300 and the GTO 302 are in die form. They do not contact each other directly but with a metal strip 308 between them. The metal strip 308 is put on the GTO's cathode, covering several cathode (emitter) fingers 310. In this form, the dimension of the GTO's cathode finger is not critical for the die form mounting. The cathode finger 310 can be as thin as possible and the MOS die can be as large as possible. On the other hand, the metal strip 308 supplies a path for horizontal current. So the MOS die is not needed to cover the whole GTO's cathode. Their number is only determined by the current capability but not their size.

Referring now to FIGS. 17A–D there is shown various views of a schematic E fabrication package. In this structure, all the components are used in their packaged forms. The packaged GTO 400 is put in the center of a round metal layer (copper layer 2) 403 which contacts the GTO's cathode. An N-MOSFET Q1 used to build the emitter-switch is put on the metal layer around the GTO 400, and a P-MOSFET Q2 is also put on the metal layer 403 around the GTO 400. In the preferred embodiment, Q1 comprises a plurality of N-MOSFETs connected in parallel around the GTO 400. The various connections can be made on board 406. Similarly, the emitter switch Q2 may comprise a plurality P-MOSFETs connected in parallel around the GTO 400. In addition, the emitter switch Q2 is not limited to P-MOSFETS, but may be any switching mechanism such as those described in FIGS. 9–14. Another metal layer (copper layer 3) 403 is put on the second metal layer 402 and acts as the ETO cathode. An insulation layer 405 electrically insulates the metal layers, 402 and 403. A top metal layer (copper layer 1) 401 is put on the anode of the GTO 400 and fasteners such as clamps or screws 404 are used to hold the structure together. Alternately, the device may simply be soldered together. The top metal layer 401 provides an additional means for dissipating heat but is not necessary for operation of the device. A positive voltage applied to the gate of the G1 of the first N-MOSFET Q1, and a current injected to terminal B turns the thyristor 400 on causing a current to flow between said anode and cathode terminals. A zero to negative voltage applied to the gate of Q1 turns the thyristor device to an off state stopping the current flow. During the turn-off, the cathode current is interrupted and is forced to transfer to the gate path, passing through the gate switch Q2 connected as a Zener diode. The ETO implemented this way is a four terminal device, providing MOS turn-off, and conventional turn-on through terminal B. Because the thyristor is sandwiched between metal plates, it has double side cooling for superior heat dissipation. In addition, since the GTO control devices Q1 and Q2 are arranged in a circular path around the GTO 400, the parasitic inductance in the current path between the anode and cathode is greatly reduced. Q1 and Q2 may be arranged in a single circle around the GTO 400 or may be arranged in two or more concentric circles around the GTO 400.

Figures 17A, 17B:
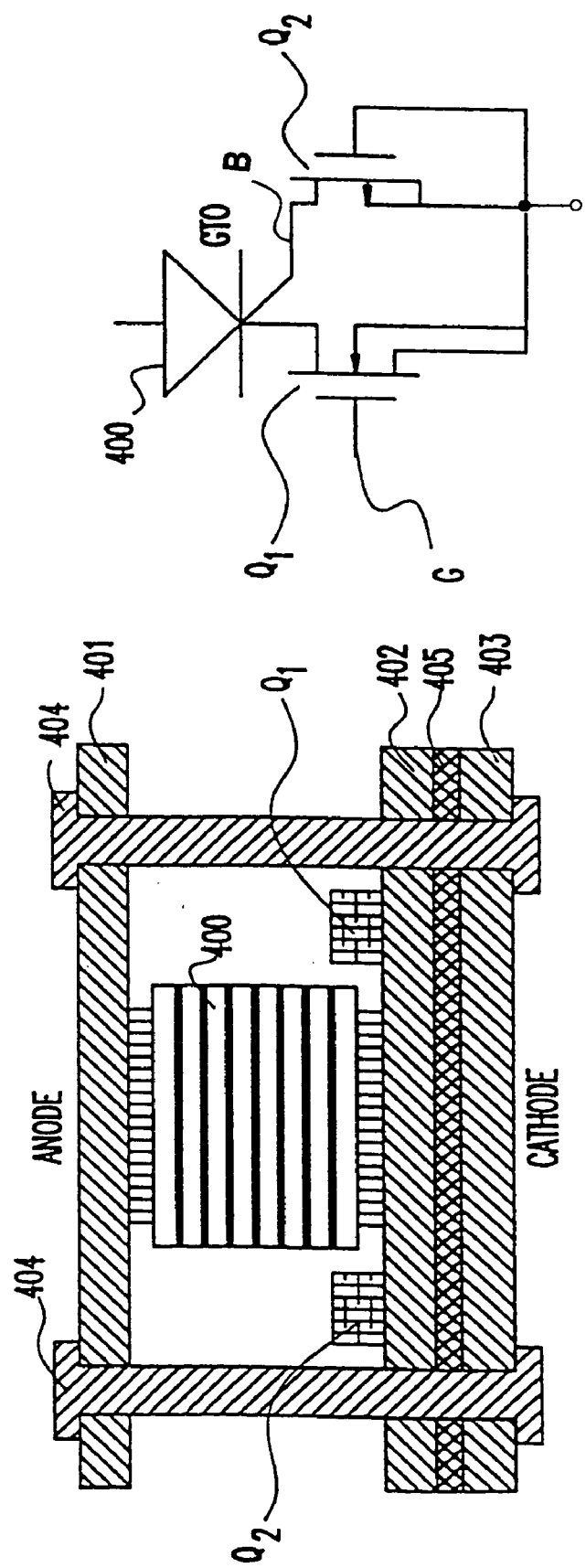
FIG. 17A is cross sectional view of an ETO packaged by connections $Q_G$ and $Q_E$ externally.
FIGS. 17B–D are an equivalent circuit, top, and perspective view, respectively, of the ETO fabrication package shown in FIG. 17A.
Figure 17C:
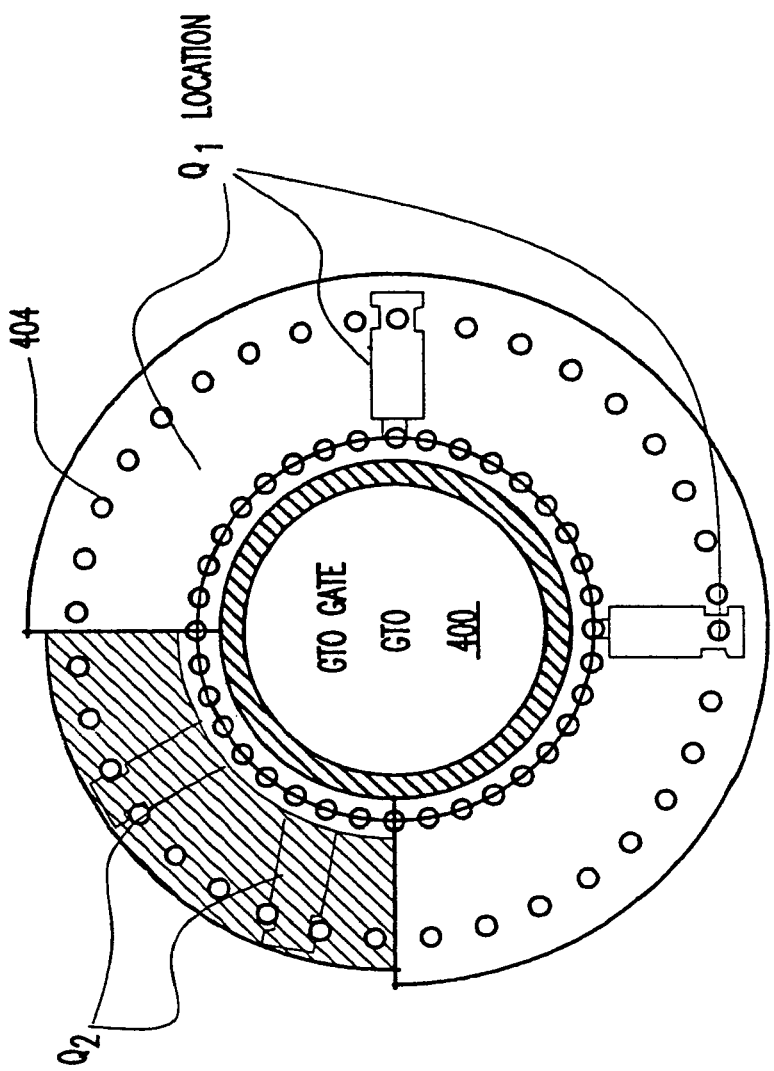
Figure 17D:
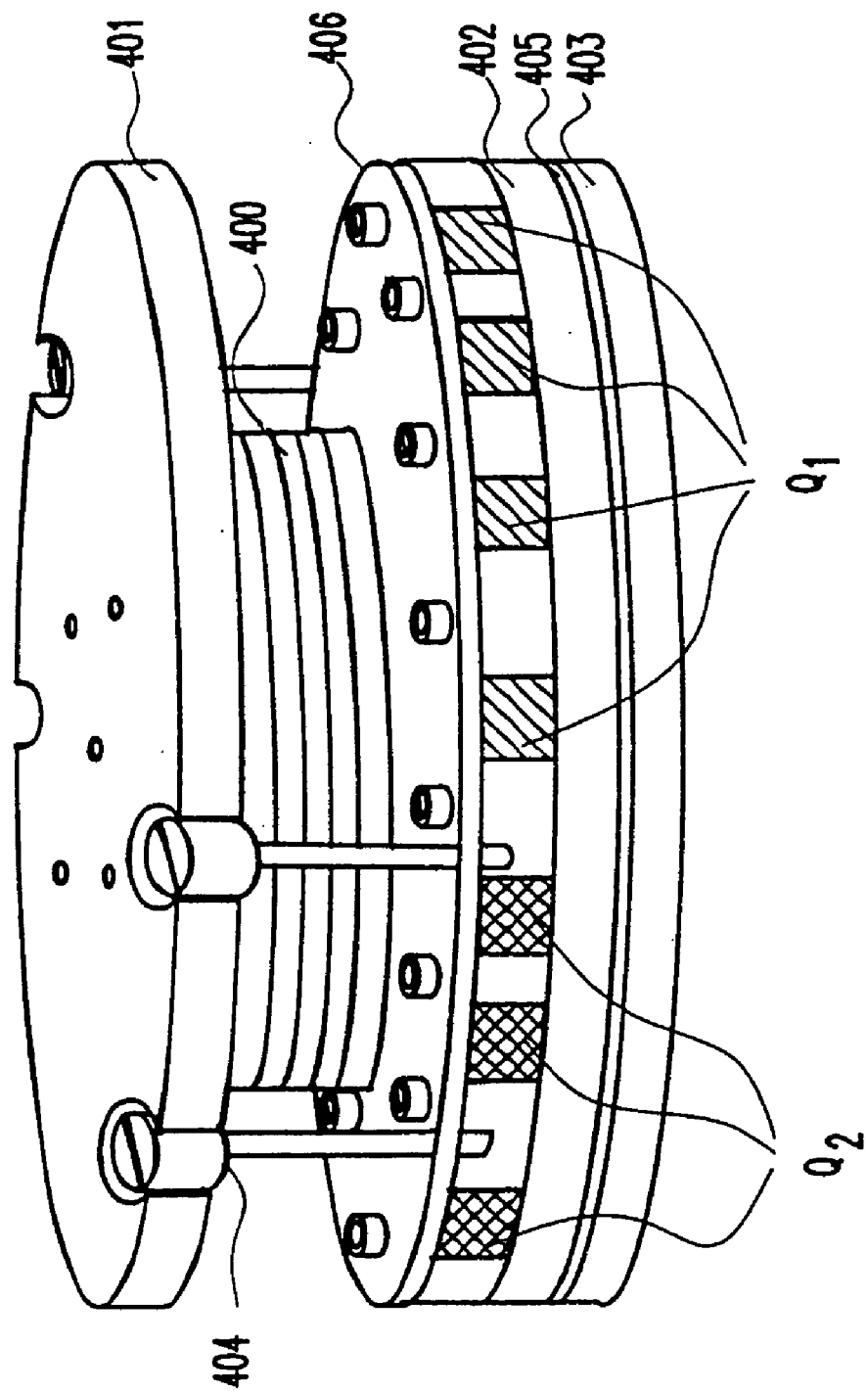
Figure 17E:
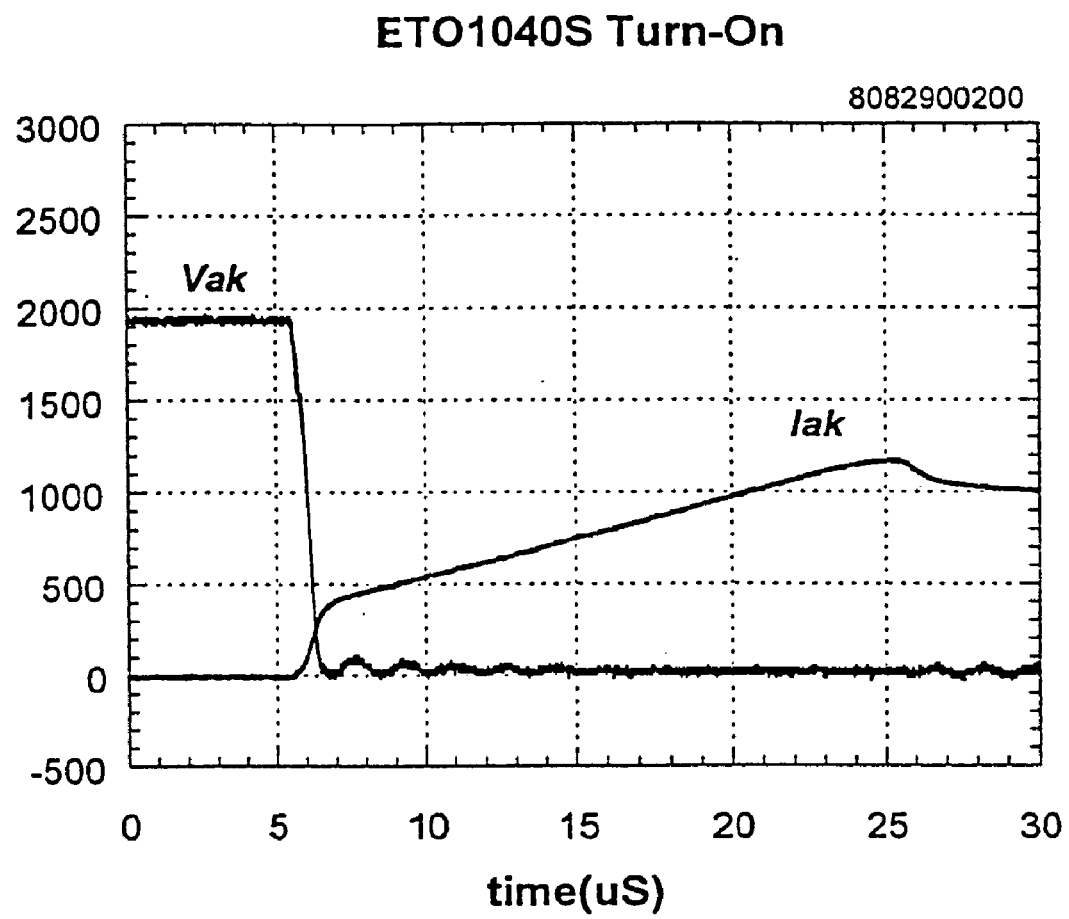
FIGS. 17E–F voltage-current turn-on and turn-off timing diagrams, respectively, for the ETO package shown in FIG. 17A.
Figure 17F:
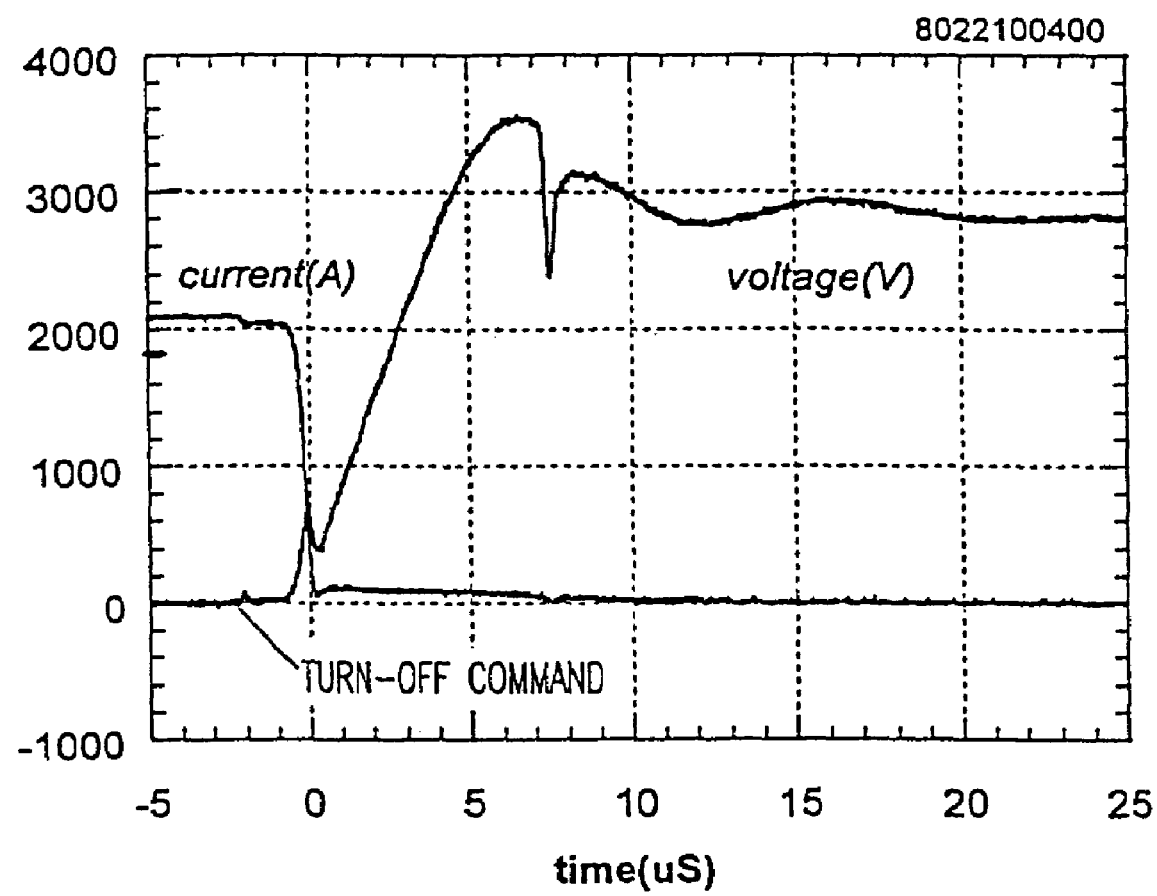

FIG. 17E shows the turn-on timing diagram for the ETO package wherein the voltage drop across the anode and cathode drops from 2000V to near 0V in about 6 $\mu$s and the current conducted between the anode and cathode goes from 0 A to about 1000 A in 25 $\mu$s. Similarly, FIG. 17F shows the turn-off timing diagram for the ETO package wherein the current flow between the anode and cathode is turned off in about 2 $\mu$s.

Figure 18:
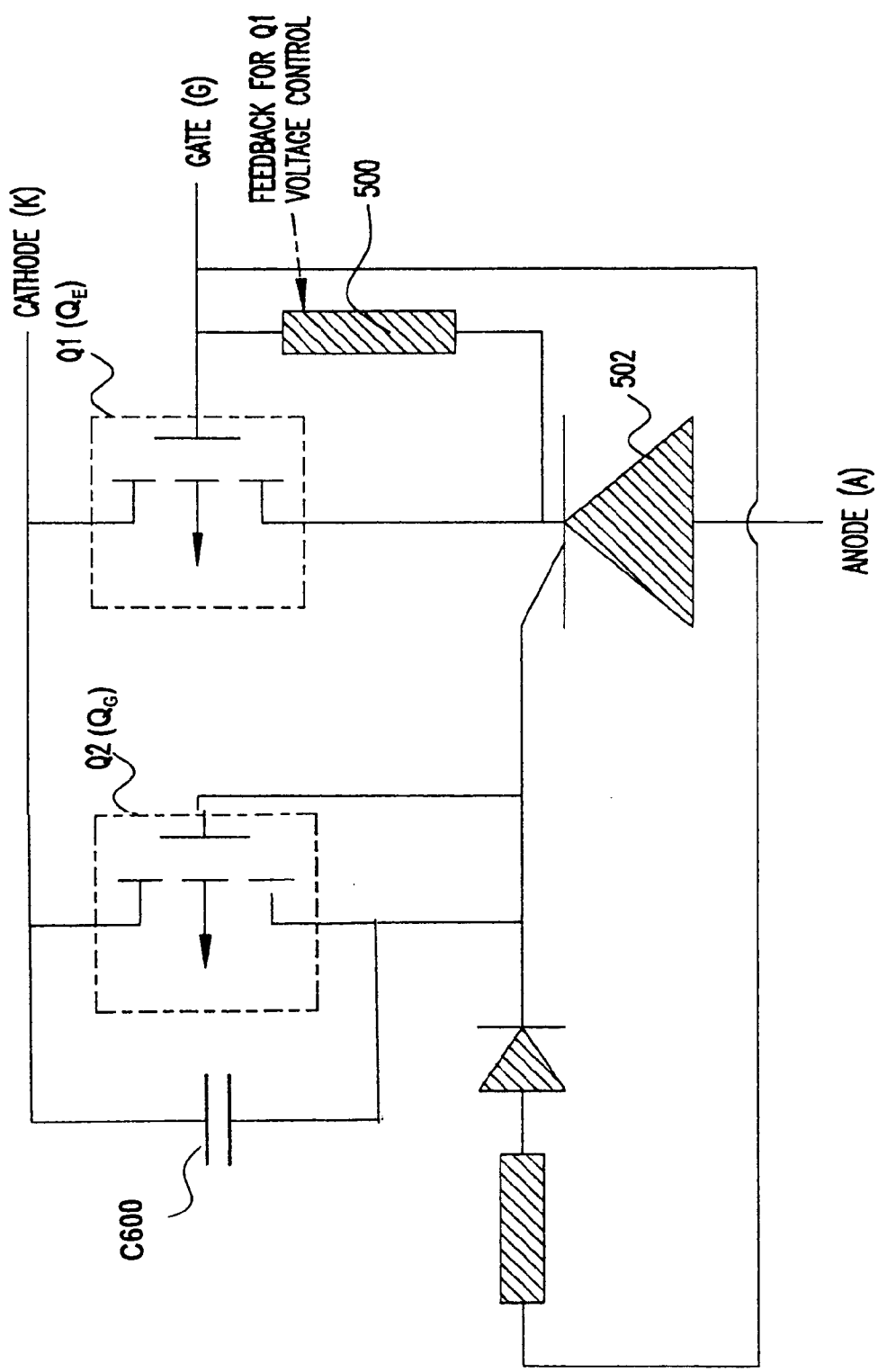
FIG. 18 is a schematic showing connection of the ETO implemented in FIGS. 17A–D that provides a three terminal solution wherein a feedback network is implemented between the gate of $Q_E$ and the drain of $Q_E$.

Referring now to FIG. 18, there is shown a different kind of connection that can be implemented in the ETO. By adding several components, a three terminal device can be obtained where both the turn-on and turn-off is controlled by one single gate, G. A negative feedback network, 500, is also implemented to control the maximum voltage on emitter switch Q1 during the turn-off of that switch. An optional capacitance C 600, is in parallel with gate switch Q2 to provide additional turn-on current. This cap is able to deliver additional turn-on current because it will store energy in a previous turn-off transient. The amount of energy is proportional to the square of the voltage on the gate switch Q2 that acts like a Zener diode, This ETO turns on when a positive voltage is added to gate and it turns off when that voltage is reduced to zero or negative.

Figure 19:
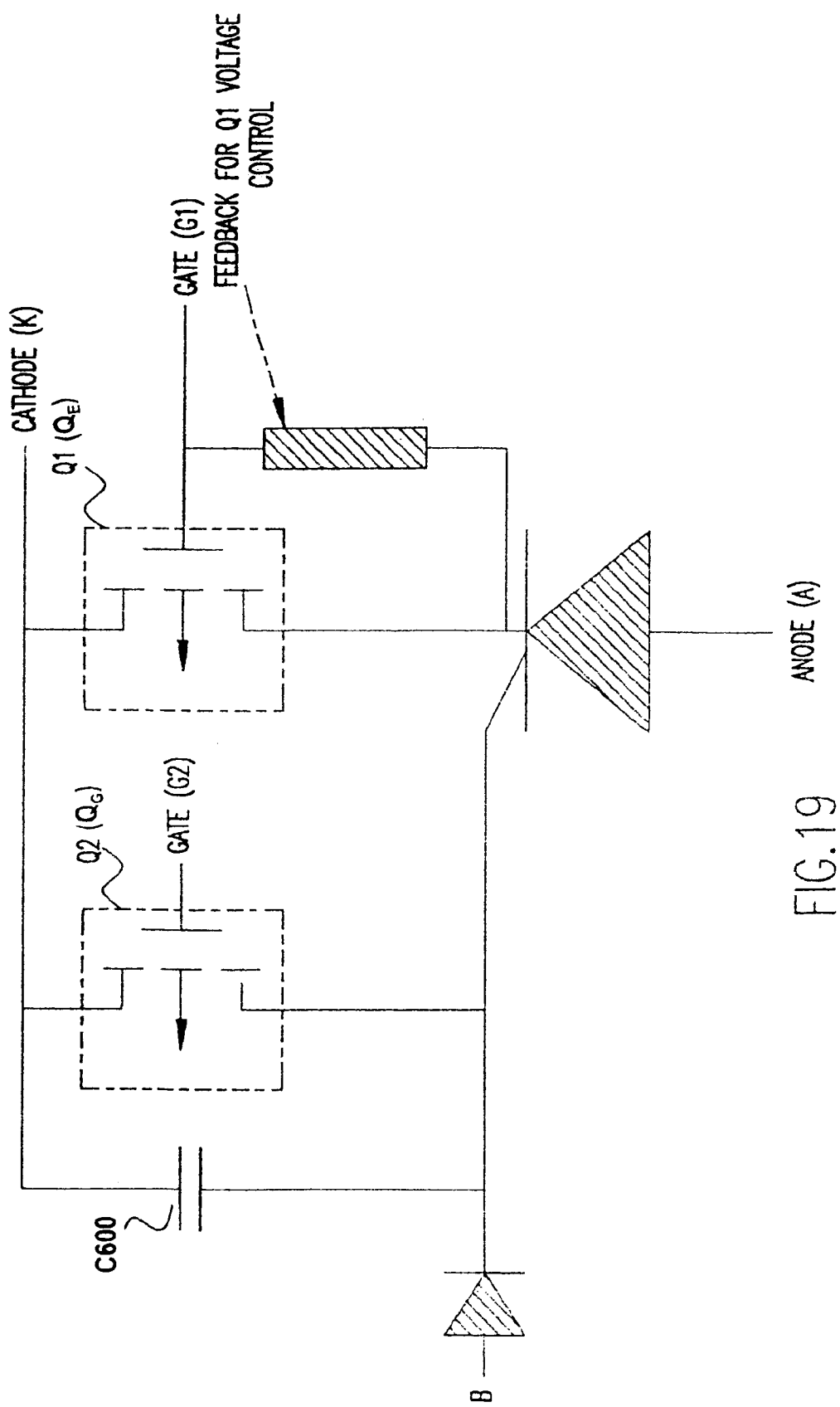
FIG. 19 is a schematic showing a ETO connection as implemented in FIGS. 17A–D that provides a separate drive signal to $Q_E$ and $Q_G$, and a capacitor C in parallel with $Q_G$.

Referring flow to FIG. 19, this circuit can also be implemented in the ETO and is similar to that shown in FIG. 18. The difference is that a separate control is added to gate switch Q2. The advantage of adding a control is that instead of having the gate switch Q2 operating like a Zener diode, hence very high power dissipation, the gate switch Q2 can operate in its linear region to reduce the impedance and thermal dissipation. The gate switch Q2 is only needed to be 'on' during the initial stage of the device turn-off when a very high anode to gate Current exists. After the passing of that high anode-to-gate current, gate switch Q2 can be turned off, allowing the anode to gate tail current to charge the capacitor.

While the invention has been described in terms of preferred embodiments, those skilled in the art will recognize that the invention can be practiced with modification within the spirit and scope of the appended claims.

I claim:

1. A thyristor device package having a cathode terminal and an anode terminal, comprising:
    a thyristor device having a thyristor emitter, a thyristor collector, and a thyristor gate, said thyristor comprising alternating P-type and N-type semiconductor regions;
    a first discrete metal oxide semiconductor (MOS) transistor connected in series with said thyristor between said cathode terminal and said thyristor emitter;
    a second discrete MOS transistor connected between said cathode terminal and said thyristor gate; and
    means for injecting current into said thyristor gate for triggering said thyristor into a latching state;
    wherein a first voltage applied to a gate terminal of said first MOS transistor causes a current to flow between said cathode terminal and said anode terminal turning said thyristor device package to an on state, and a zero to second voltage applied to said gate of said first MOS transistor turns said thyristor device package to an off state.

2. A thyristor device package as recited in claim 1 further comprising a floating ohmic contact (FOC) for shorting said emitter and a source terminal of said first MOS transistor.

3. A thyristor device package as recited in claim 1 further comprising a metal strap for shorting said thyristor emitter and a source terminal of said first MOS transistor.

4. A thyristor device package as recited in claim 1, wherein
    a gate terminal of said second MOS transistor is connected to said cathode terminal.

5. A thyristor device package comprising:
    a first metal plate;
    a second metal plate;
    a third metal plate electrically insulated from said second metal plate;
    a thyristor sandwiched between said first metal plate and said second metal plate, a collector of said thyristor contacting said first metal plate acting as an anode for said thyristor device package;
    a first discrete metal oxide semiconductor (MOS) transistor positioned on said second metal plate adjacent said thyristor, said first MOS transistor having a first terminal connected to an emitter of said thyristor and a second terminal connected to said third metal plate acting as a cathode for said thyristor device package; and
    a second discrete MOS transistor positioned on said second metal plate adjacent said thyristor, said second MOS transistor having a first terminal connected to a gate of said thyristor, said second MOS transistor further having a second terminal connected to said third metal plate, wherein a first voltage applied to a gate terminal of said first MOS transistor turns said thyristor to an on state causing a current to flow between said cathode and said anode, and a zero to second voltage applied to said gate of said first MOS transistor turns said thyristor device to an off state.

6. A thyristor device package as recited in claim 5, further comprising a clamp means for holding said first, second and third metal plates together.

7. A thyristor device package as recited in claim 5, wherein said first, second and third metal plates comprise copper plates.

8. A thyristor device package as recited in claim 5, wherein said first MOS transistor and said second MOS transistor are complementary.

9. A thyristor device package as recited in claim 5, wherein
said second discrete MOS transistor further includes a gate terminal connected to said third metal plate.

10. A thyristor device package comprising:
a gate turn-off (GTO) thyristor comprising a thyristor gate, a thyristor emitter, and a thyristor collector forming an anode terminal;
a first plurality of discrete switching devices connected in parallel and arranged in a circular fashion around said GTO thyristor, a first terminal of respective ones of said first plurality of discrete switching devices connected to said thyristor emitter and a second terminal of respective ones of said first plurality of discrete switching devices connected to a cathode terminal of said thyristor device package; and
a second plurality of discrete switching devices connected in parallel and arranged in a circular fashion around said GTO thyristor, a first terminal of respective ones of said second plurality of discrete switching devices connected to said thyristor gate and a second terminal of respective ones of said second plurality of discrete switching devices connected to said cathode terminal of said thyristor device package,
wherein a first voltage applied to gate terminals of said first plurality of discrete switching devices turns said GTO thyristor to an on state causing a current to flow between said cathode terminal and said anode terminal, and a zero to second voltage applied to said gate terminals of said first plurality of discrete switching devices turns said GTO thyristor to an off state.

11. A thyristor device package as recited in claim 10, further comprising:
a first metal plate forming said cathode terminal;
a second metal plate separated from said first metal plate by an insulation layer, wherein said GTO thyristor and said discrete switching devices of said first and second pluralities of discrete switching devices are positioned on said second metal plate, said first and second metal plates acting as a heat sink.

12. A thyristor device package as recited in claim 10 further comprising a third metal plate forming said anode terminal of said thyristor device package.

13. A thyristor device package as recited in claim 10 wherein said discrete switching devices of said second plurality of discrete switching devices comprise a diode.

14. A thyristor device package as recited in claim 10 wherein said discrete switching devices of said second plurality of discrete switching devices comprise a diode connected in parallel with a capacitor.

15. A thyristor device package as recited in claim 10 wherein said discrete switching devices of said second plurality of discrete switching devices comprise a Zener diode connected in parallel with a capacitor.

16. A thyristor device package as recited in claim 10 wherein said discrete switching devices of said second plurality of discrete switching devices comprise a transistor connected in parallel with a capacitor.

17. A thyristor device package including
a thyristor element having an anode terminal, an emitter terminal and a gate terminal,
a first discrete semiconductor switch connected in series with said emitter terminal of said thyristor element by a first terminal of said first discrete semiconductor switch,
a second discrete semiconductor switch connected in series with said gate terminal of said thyristor element by a first terminal of said second discrete semiconductor switch; second terminals of said first and second discrete semiconductor switches being connected together, and
means for shorting said emitter terminal of said thyristor element to said first a terminal of said first discrete semiconductor switch or for injecting current into said gate terminal for triggering said thyristor into a latching state;
wherein said first and second discrete semiconductor switches are arranged such that a signal of a first type applied to said first discrete semiconductor switch turns said thyristor element to an on-state and a signal of a second type applied to said first semiconductor switch turns said thyristor element to an off-state, and
wherein at least one of said first and second semiconductor switches is constituted by a plurality of semiconductor devices.

* * * * *